US010367600B2

(12) United States Patent
Oveis Gharan et al.

(10) Patent No.: US 10,367,600 B2
(45) Date of Patent: Jul. 30, 2019

(54) FORWARD ERROR CORRECTION WITH CONTRAST CODING

(71) Applicants: Shahab Oveis Gharan, Ottawa (CA); Mohammad Ehsan Seifi, Ottawa (CA); Kim B. Roberts, Ottawa (CA)

(72) Inventors: Shahab Oveis Gharan, Ottawa (CA); Mohammad Ehsan Seifi, Ottawa (CA); Kim B. Roberts, Ottawa (CA)

(73) Assignee: CIENA CORPORATION, Hanover, MD (US)

( * ) Notice: Subject to any disclaimer, the term of this patent is extended or adjusted under 35 U.S.C. 154(b) by 41 days.

(21) Appl. No.: 15/672,434

(22) Filed: Aug. 9, 2017

(65) Prior Publication Data

US 2019/0052403 A1 Feb. 14, 2019

(51) Int. Cl.
| | |
|---|---|
| *H04L 1/00* | (2006.01) |
| *G06F 17/18* | (2006.01) |
| *H03M 13/25* | (2006.01) |
| *H03M 13/29* | (2006.01) |
| *G06F 17/15* | (2006.01) |

(52) U.S. Cl.
CPC ............ *H04L 1/00* (2013.01); *G06F 17/18* (2013.01); *H03M 13/253* (2013.01); *H03M 13/29* (2013.01); *H03M 13/2948* (2013.01); *H04L 1/0041* (2013.01); *H04L 1/0045* (2013.01); *H04L 1/0063* (2013.01); *H04L 1/0064* (2013.01); *H04L 1/0066* (2013.01); *G06F 17/156* (2013.01)

(58) Field of Classification Search
CPC ..... H04L 1/004; H04L 1/0066; H04L 1/0063; H04L 1/00; H04L 11/0061; H04L 1/0064; G06F 11/10; G06F 11/1004; G06F 11/1008; G06F 11/1072
See application file for complete search history.

(56) References Cited

U.S. PATENT DOCUMENTS

| | | | |
|---|---|---|---|
| 9,088,387 B2 | 7/2015 | Oveis Gharan et al. | |
| 9,537,608 B2 | 1/2017 | Oveis Gharan et al. | |
| 10,164,735 B2 * | 12/2018 | Yu | ............................ H04N 1/00 |

(Continued)

FOREIGN PATENT DOCUMENTS

WO 0074249 12/2000

OTHER PUBLICATIONS

Caire, et al., "Bit-Interleaved Coded Modulation", IEEE Transactions on Information Theory, vol. 44, No. 3, May 3, 1998.

(Continued)

*Primary Examiner* — Shelly A Chase
(74) *Attorney, Agent, or Firm* — Integral IP; Miriam Paton; Amy Scouten

(57) ABSTRACT

In data communications, a suitably designed contrast coding scheme, comprising a process of contrast encoding at a transmitter end and a process of contrast decoding at a receiver end, may be used to adjust the contrast in bit error rate (BER) experienced by different classes of bits. Contrast coding may be used to tune the BERs experienced by different subsets of bits, relative to each other, to better match a plurality of forward error correction (FEC) schemes used for transmission of information bits, which may ultimately provide a communications system having a higher noise tolerance, or greater data capacity, or smaller size, or lower heat.

18 Claims, 9 Drawing Sheets

(56) References Cited

U.S. PATENT DOCUMENTS

2014/0019830 A1\* 1/2014 Chen .................. H04L 1/004
                                                714/776
2015/0071312 A1  3/2015 Batshon et al.

OTHER PUBLICATIONS

Wachsmann, et al., "Multilevel Codes: Theoretical Concepts and Practical Design Rules", IEEE Transactions on Information Theory, vol. 45, No. 5, Jul. 5, 1999.
Zhang, et al., "Staircase Codes with 6% to 33% Overhead", Journal of Lightwave Technology (vol. 32, Issue: 10), May 15, 2014.
Burkert, "International Search Report for PCT/IB2018/055683", dated Oct. 24, 2018.
Burkert, "Written Opinion of ISA for PCT/IB2018/055683", dated Oct. 24, 2018.
Herzberg, et al., "Concatenated Multilevel Block Coded Modulation", IEEE Transactions on Communications, vol. 41, No. 1, Jan. 1993.
Zhang, et al., "16QAM transmission with 5.2 bits/s/Hz spectral efficiency over transoceanic distance", Optics Express, vol. 20, No. 11, May 21, 2012.
Zhao, et al., "Concatenated Polar-Coded Multilevel Modulation", Proc. IEEE 10th International Conference on Communications and Networking in China, pp. 153-157, Aug. 15, 2015.
Zyablov, et al., "On error exponents for woven convolutional codes with outer warp and unequal error protection", European Transactions on Telecommunications, 14: 343-349, Jun. 2003.

\* cited by examiner

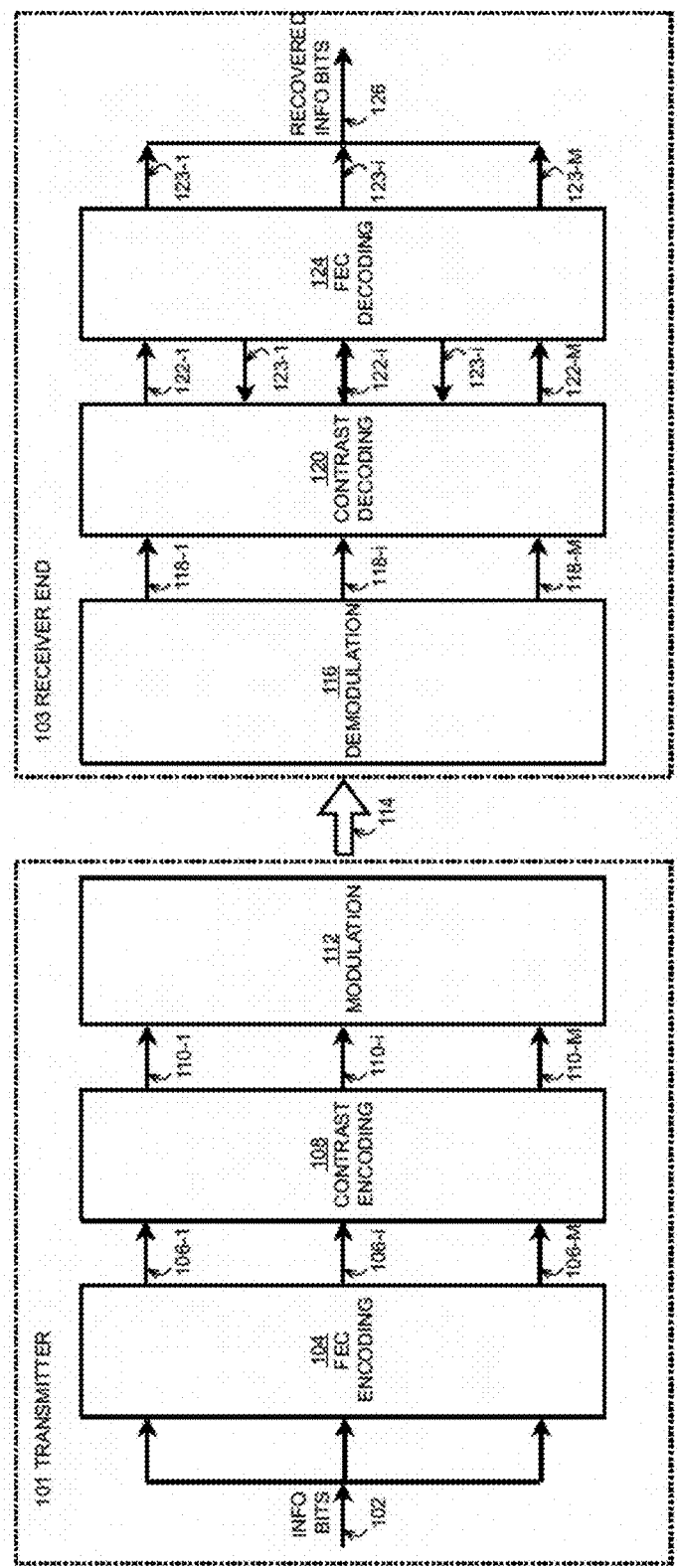

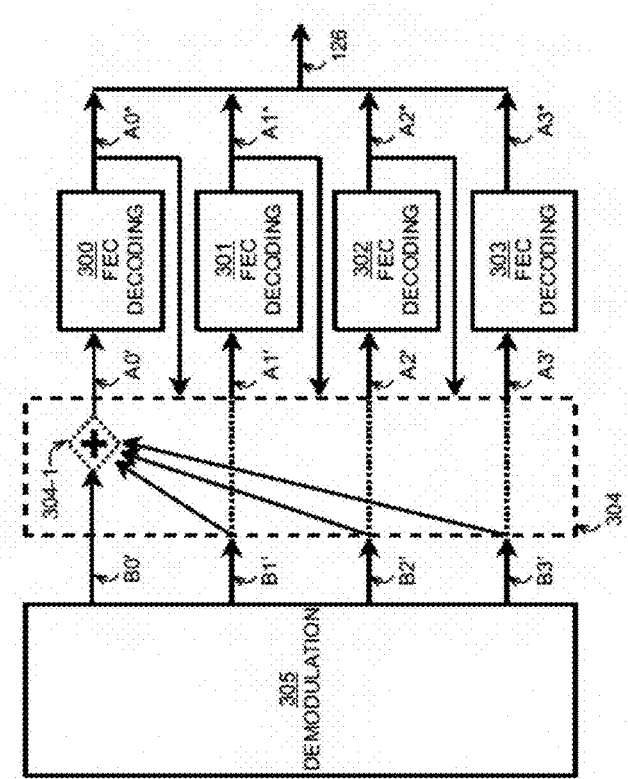
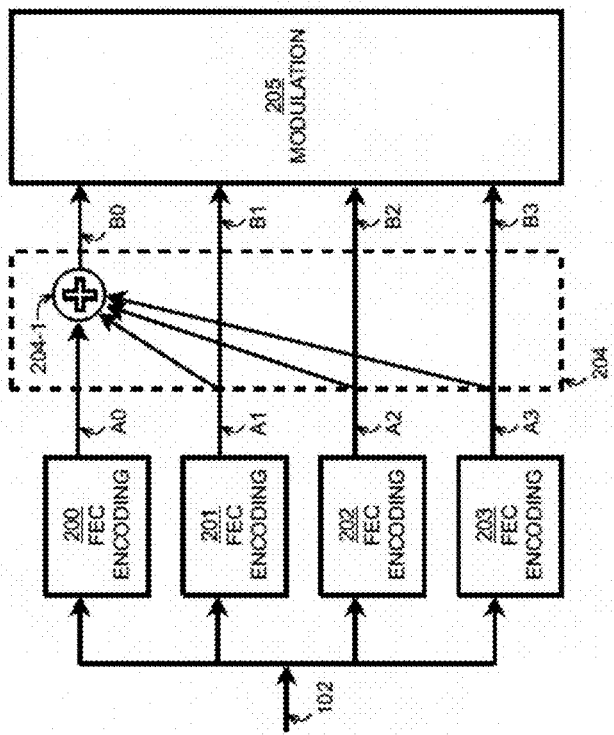
FIGURE 3
FIGURE 2

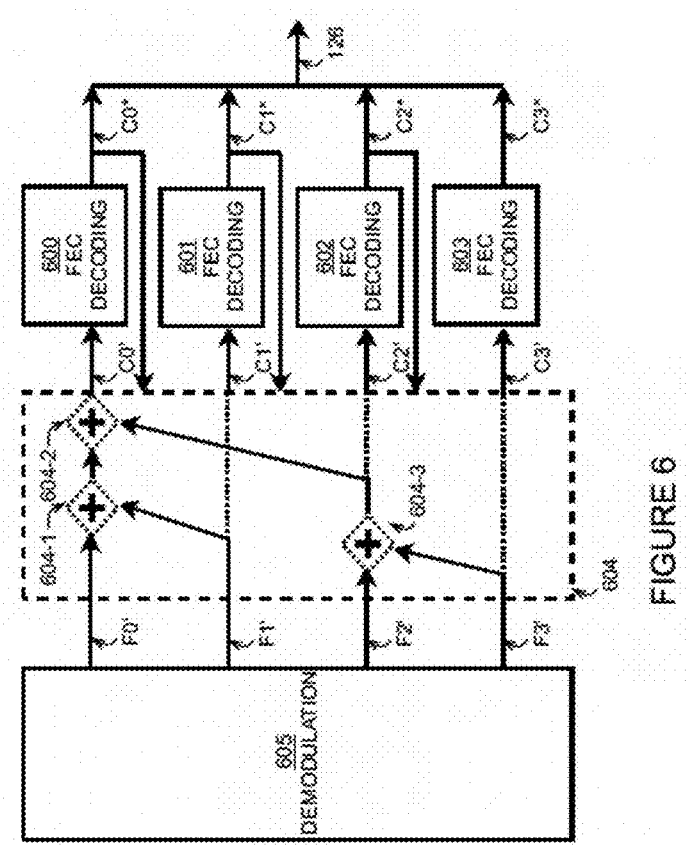
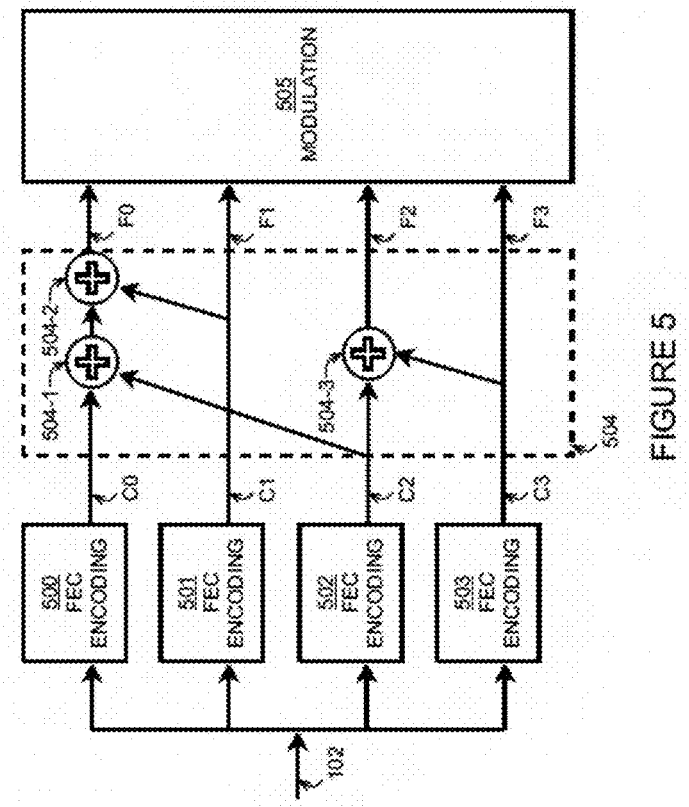
FIGURE 6
FIGURE 5

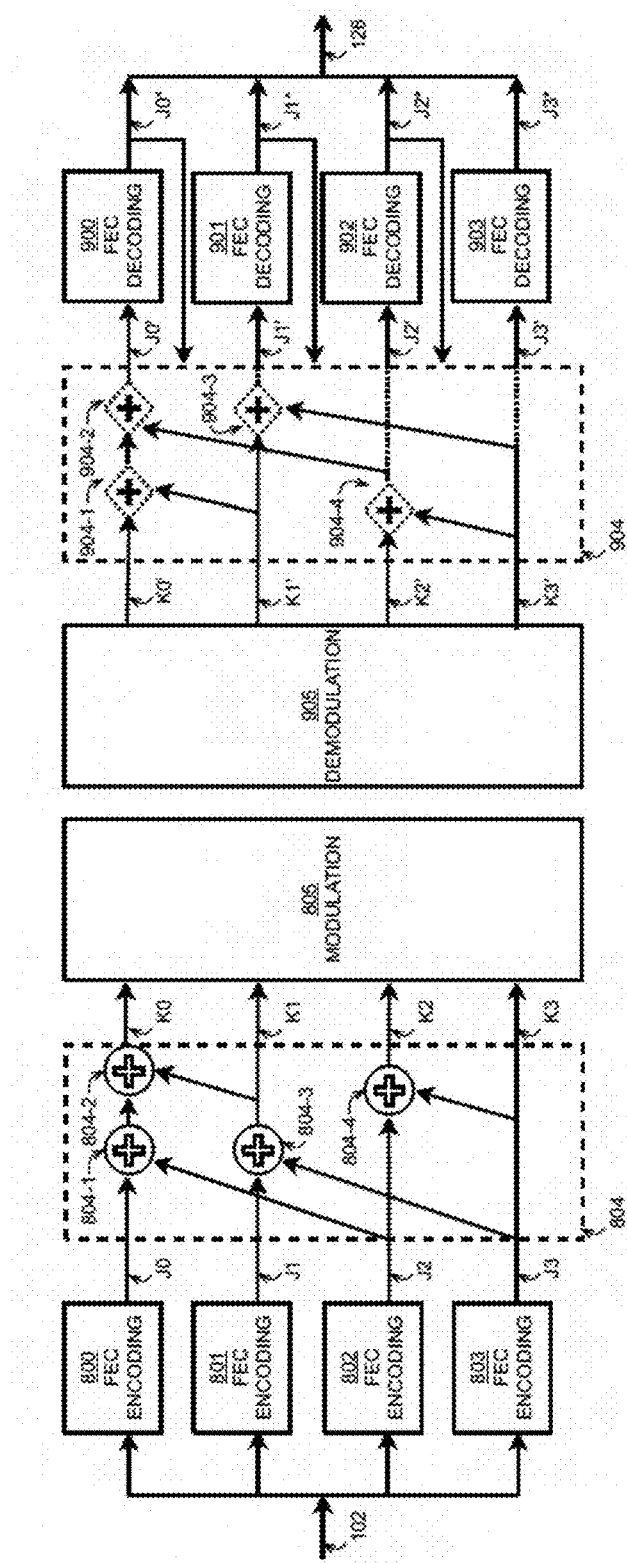

FORWARD ERROR CORRECTION WITH CONTRAST CODING

TECHNICAL FIELD

This document relates to the technical field of communications, and specifically to techniques for error control and correction.

BACKGROUND

In communications, a transmitter uses a particular modulation format to map bits of data to symbols, which it then transmits as a signal over a communications channel to a receiver. The receiver applies an inverse process of demodulation to the received signal to produce estimates of the symbols, the data bits, or both. During its transmission over the channel, the signal may experience noise and/or distortion. Noise and/or distortion may also be contributed to the signal by components of the transmitter and/or receiver. The noise and/or distortion experienced by the signal may lead to errors in the symbols or bits recovered at the receiver. Such errors may be corrected using Forward Error Correction (FEC) techniques. A FEC scheme comprises a process of FEC encoding performed at the transmitter, and an inverse process of FEC decoding performed at the receiver. The FEC encoding maps input information bits to FEC-encoded bits, which include redundant information, such as parity or check symbols. The FEC decoding subsequently uses the redundant information to detect and correct bit errors. In an optical communication network using FEC, the bits of data that undergo modulation at the transmitter have already been FEC-encoded. Similarly, the demodulation performed at the receiver is followed by FEC decoding.

FEC is advantageous in that it may permit error control without the need to resend data packets. However, this is at the cost of increased overhead. The amount of overhead or redundancy added by a FEC encoder may be characterized by the information rate R, where R is defined as the ratio of the amount of input information to the amount of data that is output after FEC encoding (which includes the overhead). For example, if FEC encoding adds 25% overhead, then for every four information bits that are to be FEC-encoded, the FEC encoding will add 1 bit of overhead, resulting in 5 FEC-encoded data bits to be transmitted to the receiver. This corresponds to an information rate R=4/5=0.8.

The reliability of a communications channel may be characterised by the Bit Error Ratio or Bit Error Rate (BER), which measures the ratio of erroneously received bits (or symbols) to the total number of bits (or symbols) that are transmitted over the communications channel. In some circumstances, the choice of modulation format may cause different subsets of bits to have different BERs. Expressed another way, one subset of bits may experience a different quality of channel than another subset of bits, depending on the manner in which the modulation format maps the bits to different symbols. For example, in the case of 4-PAM modulation with Gray labeling, the signal at a given point in time is expected to indicate one of four possible symbols or points on one axis: "00" "01" "11" "10". Each symbol represents two bits, where the rightmost bit is the least significant bit (LSB) and the leftmost bit is the most significant bit (MSB). Applying the demodulation to the signal will result in one of those four symbols, from which the two bits represented by that symbol may be recovered. Gray labeling ensures that adjacent symbols differ by only one bit. It should be apparent that the likelihood of a bit error (i.e., the BER) is inherently different for the MSB than it is for the LSB. That is, assuming a moderate noise level, there is only one scenario in which the MSB might be decoded incorrectly: if the demodulation incorrectly resulted in the "01" symbol instead of the "11" symbol (or vice versa). On the other hand, there are two scenarios in which the LSB might be decoded incorrectly: (1) if the demodulation incorrectly resulted in the "00" symbol instead of the "01" symbol (or vice versa); or (2) if the demodulation incorrectly resulted in the "11" symbol instead of the "10" symbol (or vice versa). It follows that the BER of the LSB is twice the BER of the MSB. This is an example of a modulation format that inherently produces bits having different BERs.

A variety of techniques for FEC encoding and decoding are known. The combination of a FEC encoding technique and the corresponding FEC decoding technique are herein referred to as a "FEC scheme." Stronger FEC schemes provide better protection (i.e., better error detection and correction) by adding more redundancy. However, this is at the expense of a lower information rate R. Circuitry to implement stronger FEC schemes may also take up more space, may be more costly, and may produce more heat than circuitry to implement weaker (i.e., higher-rate) FEC schemes. The choice of FEC schemes that are used for particular applications may be dictated by the specific requirements of those applications and by the quantities and classes or types of FEC schemes that are available.

In "Multilevel codes: theoretical concepts and practical design rules" (*IEEE Transactions on Information Theory*, Vol. 45, Issue 5, July 1999), Wachsmann et al. describe techniques for multilevel coding and multistage decoding. Multilevel coding attempts to exploit differences in BERs between bits. Decoded bits having different BERs may be sent to different classes of FEC schemes, where each class of FEC scheme is optimized for a particular BER or confidence value distribution, where the confidence value represents the confidence in the estimated value for a bit. An example of a confidence value is a log likelihood ratio. As an example, with layered encoding in a single real dimension, the points of a PAM constellation are labeled such that the information bits are grouped into L different binary layers in ascending order of capacities. The early layers with lower capacities are protected with stronger FEC schemes while the layers with higher capacities are protected with a higher-rate FEC scheme.

Chain decoding differs from multilevel coding in that it attempts to exploit a dependency between bits. U.S. Pat. No. 9,088,387 describes a technique for chain decoding, in which a sequence of tranches is decoded, and each tranche is sent through a FEC decoder before using the error-free bits outputted by the FEC decoder to assist in the next tranche of decoding. The use of the error-free bits can significantly improve the BERs of the later bits. Rather than designing multiple classes of FEC schemes for different bits, as is done in multilevel coding, an advantageous version of chain decoding sends all of the bits through the same FEC scheme, but in a successive manner so that previously decoded bits may be used in the decoding of subsequent bits.

In "Bit-interleaved coded modulation" (*IEEE Transactions on Information Theory*, Vol. 44, Issue 3, May 1998), Caire et al. describe a FEC technique whereby multiple bits are decoded from each symbol, and those bits are treated as independent bits in the FEC scheme, rather than being treated symbol by symbol. Bit-interleaved coded modulation may use Gray coding in order to reduce the average number of bit errors caused by a symbol error. With Gray coding, nearest neighbour symbols differ by one bit, and so almost all symbol errors cause a single bit error. The number of bits that differ between two symbols is defined as the "Hamming distance" between those symbols.

U.S. Pat. No. 9,537,608 describes a FEC technique referred to as staggered parity, in which parity vectors are computed such that each parity vector spans a set of frames; a subset of bits of each frame is associated with parity bits in each parity vector; and a location of parity bits associated with one frame in one parity vector is different from that of parity bits associated with the frame in another parity vector.

In "Staircase Codes with 6% to 33% Overhead" (*Journal of Lightwave Technology*, Vol. 32, Issue 10, May 2014), Zhang and Kschischang describe an example of a high-rate FEC scheme.

In "Recent Progress in Forward Error Correction for Optical Communication Systems" (*IEICE transactions on communications*, Vol. 88, No 5, 2005), Mizuochi reviews the history of FEC in optical communications, including types of FEC based on concatenated codes.

SUMMARY

This document proposes applying contrast coding to a set of bits in order to adjust the BERs experienced by different classes of the bits so as to better match a particular set of FEC encoding/decoding schemes and a particular modulation format. The contrast in BERs between different bit classes may be enhanced or reduced using a suitably designed contrast coding scheme, which comprises contrast encoding performed at a transmitter end, and contrast decoding performed at a receiver end, where the contrast decoding attempts to recover contrast-encoded bits in the presence of noise. Contrast coding may be used to tune the BERs experienced by different subsets of bits, relative to each other, to better match a plurality of FEC schemes, where the FEC schemes provide at least two distinct information rates R. Depending on the needs of a particular application, different numbers of bits may be sent through different FEC schemes, and may also experience different overheads. In combination with the modulation format and the available FEC encoders and decoders, contrast coding may be used to achieve a higher noise tolerance, or greater data capacity, or smaller sized communications system, or lower heat implementation.

In one example, at a transmitter end, FEC encoding may be applied to a set of information bits to generate a first set of FEC-encoded bits consisting of a plurality of subsets, wherein the FEC-encoded bits of any one subset have an information rate R that is distinct from information rates of the FEC-encoded bits of the other subsets. Contrast encoding may then be applied to the first set of FEC-encoded bits to generate a second set of contrast-encoded bits, where the second set comprises at least one group consisting of contrast-encoded bits that are dependent on the FEC-encoded bits of at least two of the plurality of subsets. Symbols formed from the contrast-encoded bits may be modulated for transmission over a communications channel to a receiver end. At the receiver end, a set of bit estimates may be computed from the symbols detected in the received signal. A contrast decoding operation, which is the inverse of the contrast encoding applied at the transmitter end, may be applied to the set of bit estimates to generate a first class of contrast-decoded bit estimates having a first BER. A first FEC decoding operation may be applied to the contrast-decoded bit estimates of the first class to generate a first subset of error-free bits. Using the contrast decoding operation and the error-free bits of the first subset, a second class of contrast-decoded bit estimates may be generated. The contrast-decoded bit estimates of the second class may have a second BER that is less than the first BER. A second FEC decoding operation may be applied to the contrast-decoded bit estimates of the second class to generate a second subset of error-free bits. This process of successive decoding may be repeated until all of the error-free bits have been outputted. Assuming that all of the bit errors have been corrected by the FEC schemes, the subsets of error-free bits, when combined, should be identical to the set information bits that was transmitted from the transmitter end.

Numerous methods for contrast coding are contemplated. For example, contrast coding may comprise the calculation of a Boolean polynomial, such as a repetition code, a single parity polynomial, a tree polynomial, a mesh polynomial, or addition modulo M>2. In another example, contrast coding may produce a constellation of symbols, wherein a first pair of symbols in the constellation has a Hamming distance of one, and a second pair of symbols in the constellation has a Hamming distance of greater than one, and wherein the first pair has a higher noise tolerance than the second pair. The contrast coding examples presented herein use single bit polynomials for clarity and simplicity of implementation. However, multi-bit methods could also be used. Additionally, the use of non-polynomial functions, implemented for example in a lookup table, is contemplated.

BRIEF DESCRIPTION OF THE DRAWINGS

FIG. 1 schematically illustrates an example communications system configurable to implement Forward Error Correction (FEC) with contrast coding;

FIG. 2 schematically illustrates an example architecture of a transmitter end implementing FEC with contrast encoding;

FIG. 3 schematically illustrates an example architecture of a receiver end implementing FEC with contrast decoding corresponding to the FEC and contrast encoding of FIG. 2;

FIG. 5 schematically illustrates an example architecture of a transmitter end implementing FEC with contrast encoding;

FIG. 6 schematically illustrates an example architecture of a receiver end implementing FEC with contrast decoding corresponding to the FEC and contrast encoding of FIG. 5;

FIG. 8 schematically illustrates an example architecture of a transmitter end implementing FEC with contrast encoding;

FIG. 9 schematically illustrates an example architecture of a receiver end implementing FEC with contrast decoding corresponding to the FEC and contrast encoding of FIG. 8;

DETAILED DESCRIPTION

Figure 4:
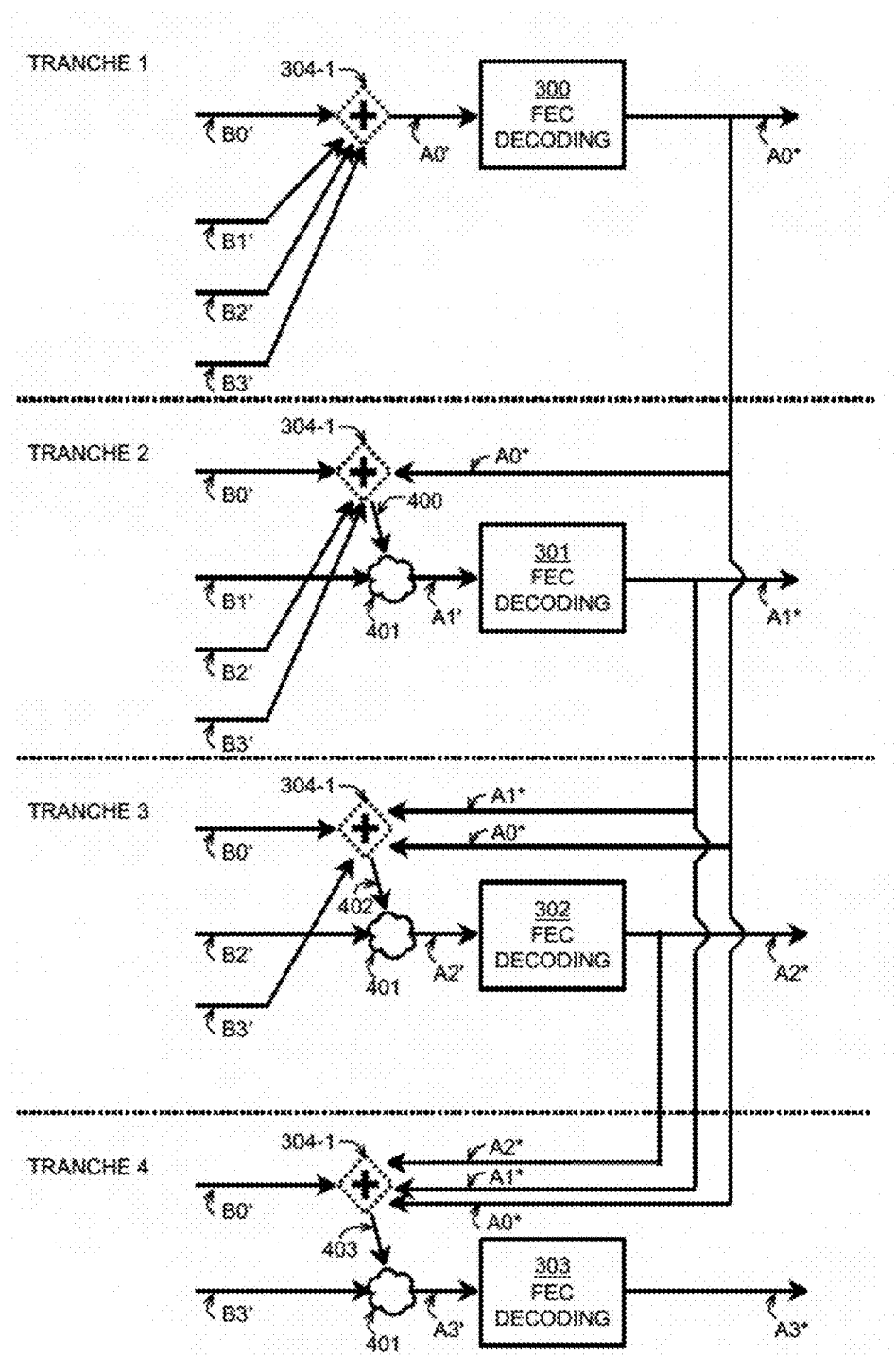
FIG. 4 schematically illustrates decoding steps performed at the receiver end of FIG. 3.

FIG. 1 schematically illustrates an example communications system 100 configurable to implement Forward Error Correction (FEC) with contrast coding. The communications system 100 comprises a transmitter end 101 and a receiver end 103, the transmitter end 101 being configured to transmit a signal 114 to the receiver end 103 over a communications channel, where the signal 114 is representative of data to be communicated from the transmitter end 101 to the receiver end 103. The signal 114 may be transmitted optically, for example using optical fibers, or using other means of wired or wireless communications, with one or more carriers or baseband.

FIG. 1 is merely a schematic illustration. It should be understood that each of the transmitter end 101 and the receiver end 103 may be embodied by one or more electronic devices and may comprise additional hardware and/or software components that are not shown in FIG. 1. For example, each of the transmitter end 101 and the receiver end 103 may comprise memory, for example, in the form of a non-transitory computer-readable medium, which stores computer-executable instructions for performing the methods described herein, and one or more processors configurable to execute the instructions. The boxes illustrated in solid lines may be understood to represent computer-executable processes to be executed by the respective processors at the transmitter end 101 and the receiver end 103. More specifically, one or more processors at the transmitter end 101 are configurable to execute code for implementing the processes of FEC encoding 104, contrast encoding 108, and modulation 112, as will be described in more detail below. Similarly, one or more processors at the receiver end 103 are configurable to execute code for implementing demodulation 116, contrast decoding 120, and FEC decoding 124, as will be described in more detail below.

The signal 114 is representative of symbols to be transmitted from the transmitter end 101 to the receiver end 103, the symbols having been generated according to a particular modulation format defined by the modulation process 112 performed at the transmitter end 101, and where each symbol represents a plurality of bits. The symbols, and estimates of the bits they represent, may be recoverable from the corresponding demodulation process 116 performed at the receiver end 103, where the demodulation 116 is the inverse of the modulation 112. A bit estimate may comprise a binary value, or may comprise a confidence value, such as log-likelihood ratio. A log-likelihood ratio (LLR) is defined as the logarithm of the ratio of the probability of a bit being equal to zero to the probability of that bit being equal to one. For example, for a bit "b", LLR(b)=log $$\frac{P(b=0)}{P(b=1)},$$

where P denotes probability.

During its transmission from the transmitter end 101 to the receiver end 103, the signal 114 may experience noise and/or distortion, including contributions of noise and/or distortion from components of the transmitter end 101 and receiver end 103 themselves. The noise and/or distortion may lead to errors in the symbols recovered from the demodulation 116, as well as errors in the bits represented by the symbols. For simplicity, the noise experienced by the signal 114 is assumed herein to be anisotropic additive Gaussian noise. With this assumption, the BER of a bit is a simple Gaussian function of the effective Euclidean distance between the pairs of symbols that differ by that bit. At moderate error rates, and approximately equal probability of occurrence of pairs of symbols, the effective Euclidean distance is dominated by the minimum Euclidean distance. In other words, the errors between nearest neighbours dominate. This means that the pairs of symbols that are separated by a smaller Euclidean distance are more likely to be mistaken for one another. This is because these pairs require less additive Gaussian noise to be mistaken for each other, compared to those pairs that are separated by a larger Euclidean distance. Thus, the majority of symbol errors are due to symbol pairs that are at a minimum Euclidean distance being mistaken for each other. In more complicated situations, a probability integral may be needed to calculate the effective Euclidean distance.

The choice of modulation format may or may not cause different classes of bits to experience different BERs. For example, as previously discussed, when using 4-PAM modulation with Gray labeling, LSB bits experience twice the BER of MSB bits. Accordingly, this particular modulation format produces two classes of bits, each associated with a different BER or channel quality. On the other hand, if an independently, identically distributed (IID) modulation format is used, the likelihood of a bit error is identical for any bit, meaning that all bits experience the same BER.

As previously discussed, FEC techniques may be used to detect and correct bit errors. Although a variety of FEC schemes are known, the selection of one or more FEC schemes for a particular application may be dictated by the specific requirements of that application and by the quantities and classes of FEC encoders/decoders that are available. Stronger FEC schemes may provide better noise protection, but at the expense of a lower information rate R, higher space occupancy, higher cost, and/or more heat.

This document proposes applying contrast coding to a set of bits in order to adjust the BERs experienced by different classes of the bits so as to better match a particular set of FEC encoding/decoding schemes and a particular modulation format. The contrast in BERs between different bit classes may be enhanced or reduced using a suitably designed contrast coding scheme, which comprises contrast encoding performed at a transmitter end, and contrast decoding performed at a receiver end, where the contrast decoding is the inverse of the contrast encoding. Contrast coding may be used to tune the BERs experienced by different subsets of bits, relative to each other, to better match a plurality of FEC schemes, where the FEC schemes provide at least two distinct information rates R. Depending on the needs of a particular application, different numbers of bits may be sent through different FEC schemes, and may also experience different overheads. In combination with the modulation format and the available FEC encoders and decoders, contrast coding may be used to achieve a higher noise tolerance, or greater data capacity, or smaller sized communications system, or lower heat implementation.

As illustrated in FIG. 1, a block or set of information bits 102 may undergo FEC encoding 104 at the transmitter end 101, to generate a first set of FEC-encoded bits 106. The FEC encoding 104 may comprise M parallel disjoint FEC computations, producing M subsets of FEC-encoded bits, where M≥2. The $i^{th}$ subset of FEC-encoded bits is denoted 106-$i$, where i=1 . . . M. The FEC encoding 104 provides N levels of protection/redundancy, where N≥2. Accordingly, the first set of FEC-encoded bits 106 may be understood as consisting of N classes, where the FEC-encoded bits of any one class have an information rate R that is distinct from information rates of the FEC-encoded bits of the other classes. It will be apparent that the number of subsets M will be equal to or greater than the number of classes N, that is M≥N. The first set of FEC-encoded bits 106 may then undergo contrast encoding 108 to generate a second set of contrast-encoded bits 110. As illustrated in FIG. 1, application of the contrast encoding 108 to the M subsets of FEC-encoded bits produces M subsets of contrast-encoded bits, where the contrast-encoded bits of the $i^{th}$ group are denoted 110-$i$. Importantly, the nature of the contrast encoding 108 is such that the second set of contrast-encoded bits 110 comprises at least one subset consisting of contrast-encoded bits that are dependent on FEC-encoded bits having at least two different information rates. In other words, there is at least one subset 110-$i$ that consists of contrast-encoded bits that are dependent on the FEC-encoded bits of at least two of the N classes. In this manner, the contrast encoding 108 creates a dependency between the bits that undergo the modulation 112, and are subsequently transmitted over the communications channel in the form of the signal 114.

Examples of the contrast encoding 108 include the calculation of a Boolean polynomial, such as a repetition code, a single parity polynomial, a tree polynomial, a mesh polynomial, or addition modulo-2 or greater. In another example, the contrast encoding 108 may produce a constellation of symbols, wherein a first pair of symbols in the constellation has a Hamming distance of one, and a second pair of symbols in the constellation has a Hamming distance of greater than one, and wherein the first pair has a higher noise tolerance than the second pair. The contrast encoding examples presented herein use single bit polynomials for clarity and simplicity of implementation. However, multi-bit methods could also be used. Additionally, the use of non-polynomial functions, implemented for example in a lookup table, is contemplated.

Each FEC encoding computation of the FEC encoding 104 may be considered an invertible function, which has a corresponding FEC decoding computation at the receiver end 103. The combined FEC decoding computations are denoted by FEC decoding 124 in FIG. 1. Similarly, the contrast encoding process 108 may be considered an invertible function which has a corresponding contrast decoding process 120 at the receiver end 103. In general, the combination of the contrast encoding 108 performed at the transmitter end 101, and the contrast decoding 120 performed at the receiver end 103 are referred to herein as "contrast coding" or "a contrast coding scheme".

The advantages of contrast coding may be best understood by considering the signal processing that is performed at the receiver end 103. After applying the demodulation process 116 to the signal 114, a plurality of symbols may be detected at the receiver end 103. From the symbols, a set of bit estimates 118 may be decoded. As previously noted, a bit estimate is not necessarily a binary value, but may comprise a confidence value such as a log-likelihood ratio. As a result of the contrast encoding 108 that was performed at the transmitter end 101, the set of bit estimates 118 recovered from the demodulation 116 consists of M subsets, where the bit estimates of the $i^{th}$ subset are denoted 118-$i$.

As a result of the dependency between bits that was created by the contrast encoding 108 performed at the transmitter end 101, it may be advantageous to perform the processes of contrast decoding 120 and FEC decoding 124 in a successive manner at the receiver end 103. In a first stage or tranche, the contrast decoding 120 may be applied to the set of bit estimates 118 to generate a first class 122-1 of contrast-decoded bit estimates. The contrast-decoded bit estimates of the first class 122-1, which have a first BER, may be sent through the particular one of the FEC decoding computations 124 that is the inverse of the particular FEC encoding computation 104 that produced the subset 106-1 of FEC-encoded bits at the transmitter end 101. As a result of contrast coding, the first BER may be tailored for a FEC scheme having a particular noise tolerance, such that FEC decoding of the first class 122-1 of bit estimates produces a first subset 123-1 of error-free bits. The first subset 123-1 of error-free bits forms part of the recovered information bits 126. However, the first subset 123-1 may also provide additional information that can be used in a second tranche of the contrast decoding 120 in order to generate a second class 122-2 of contrast-decoded bit estimates. In other words, the error-free bits of the first subset 123-1 may be fed back into the contrast decoding 120 that is applied to the bit estimates 118, and the additional information provided by the error-free bits of the first subset 123-1 may be exploited into the calculation of the second class 122-2 of contrast-decoded bit estimates. The contrast-decoded bit estimates of the second class 122-2, which have a second BER, may then be sent through the particular one of the FEC decoding computations 124 that is the inverse of the particular FEC encoding computation 104 that produced the subset 106-2 of FEC-encoded bits at the transmitter end 101. The second BER may be less than the first BER. The noise tolerance of the FEC scheme applied to the second class 122-2 of contrast-decoded bit estimates should be suitable for the second BER, such that FEC decoding of the second class 122-2 produces a second subset 123-2 of error-free bits. The second subset 123-2 forms part of the recovered information bits 126. One or both of the first subset 123-1 and the second subset 123-2 may also be fed back into a third tranche of the contrast decoding 120 to assist in the calculation of a third class 122-3 of contrast-decoded bit estimates. This process of using one or more subsets of previously decoded error-free bits to assist in the calculation of subsequent bit estimates may be repeated until the bit estimates of the $M^{th}$ class have undergone the appropriate FEC decoding computation 124 to produce the subset 123-M of error-free bits, thereby enabling all of the information bits 126 to be recovered.

As will be explained in more detail in the specific examples below, a suitably designed contrast coding scheme may be used to adjust the contrast in BER between different classes of bits in order to better match the noise tolerance of a plurality of FEC schemes to be used with a particular modulation format.

While there are existing techniques that involve applying an invertible function X after FEC encoding at the transmitter, FEC with contrast coding differs from each of these existing techniques in important ways. For example, the known technique of using a function X at the transmitter end, where X inserts known bits after FEC encoding, such as framing or training symbols, does not directly alter the BER of the bits that are output from the inverse function $X^{-1}$ at the receiver end. Similarly, the known technique of using a function X that inserts additional information bits after FEC encoding, such as for an orderwire or wayside channel, also does not directly alter the BER of the bits that are output from the inverse function $X^{-1}$. Nor does the known technique of using a function X that encrypts, scrambles, or interleaves FEC-encoded bits. Finally, using a function X that inserts redundancy, such as in FEC encoding or parity values (i.e., concatenated coding), as discussed by Mizuochi, may reduce the BER of the bits output from the inverse function $X^{-1}$. However, the use of such a function X does not alter the contrast in BER between the outputted bits. This is contrary to the contrast coding schemes proposed herein, which not only alter the BER of the outputted bits, but also alter the contrast in BER between different classes of outputted bits.

It should be noted that, although FIG. 1 illustrates the contrast encoding 108 being performed after the FEC encoding 104, the contrast encoding 108 may alternatively be performed prior to the FEC encoding 104. In this case, the order of the contrast decoding 120 and FEC decoding 124 performed at the receiver end would also be switched.

It should be noted that the plurality of FEC schemes defined by the FEC encoding processes 104 and corresponding FEC decoding processes 124 may comprise a Null FEC scheme, which may be understood as a FEC scheme that does not add any redundancy or overhead, such that it is associated with an information rate R of approximately 1.0. In this case, the BER of the relevant class of bits out of the contrast decoding would be expected to be low enough to satisfy the customer application without the benefit of FEC.

For ease of explanation, the processes of FEC encoding/decoding and contrast encoding/decoding may be described herein with reference to individual bits. However, it should be understood that these processes may be performed on a block of data at a time, where one block might consist of thousands of bits, for example For clarity, the FEC schemes used in the following examples are assumed to be disjoint bit-interleaved for each different information rate R. More complicated inter-tangled methods could be used. Multi-bit FEC could be used rather than bit-interleaved. For example, the FEC scheme could use eight-bit symbols rather than single bits.

The general architecture of FIG. 1 may be applied in specific implementations of FEC with contrast coding, as provided in the following examples.

A first example of FEC with contrast coding is illustrated in FIGS. 2, 3, and 4, where FIGS. 2 and 3 schematically illustrate the transmitter end and receiver end, respectively, and FIG. 4 schematically illustrates the successive decoding steps performed at the receiver end. In this first example, it is assumed that an IID modulation format is used for data transmission. Accordingly, each bit estimate recovered from demodulation at the receiver end is expected to be independent of the other recovered bit estimates and to have the same BER. An example of an IID modulation format is binary phase-shift keying (BPSK). With no dependency between the bits, there would be no advantage achieved by successively decoding the bits as is done in chain decoding.

This document proposes contrast encoding bits prior to modulation at the transmitter end, so that the inverse process of contrast decoding (performed at the receiver end after the demodulation) may be used to produce bits having a plurality of different BERs. By adjusting the relative BERs of the bits, it may be possible to create different classes of bits, where the classes are tuned to match a particular set of FEC schemes, based on the availability of FEC encoders/decoders and according to other requirements, such as cost limitations, heat specifications, size and data capacity.

In this first example, contrast coding is achieved using a single parity polynomial.

Referring to FIG. 2, the original information bits 102 may be divided amongst a plurality of FEC encoding processes 200, 201, 202, and 203, in order to generate subsets A0, A1, A2, and A3 of FEC-encoded bits, respectively. The FEC-encoded bits of the subsets A0, A1, A2, and A3 have corresponding information rates R0, R1, R2, and R3, respectively, which depend on the strengths of the respective FEC-encoding processes 200, 201, 202, and 203. As will be discussed with respect to FIG. 3, the receiver end is configured to perform a plurality of FEC decoding processes 300, 301, 302, and 303, which correspond, respectively, to the FEC encoding processes 200, 201, 202, and 203 performed at the transmitter end.

In this example, the FEC encoding process 200 is stronger than the FEC encoding processes 201, 202, and 203. Accordingly, those of the information bits 102 that undergo the FEC encoding process 200 are provided with more protection/redundancy than the rest of the information bits 102. Thus, it may be said that the FEC-encoded bits of the subset A0 have a distinct information rate R0 that is lower than the information rates R1, R2, and R3 of the FEC-encoded bits of the other subsets A1, A2, and A3. The information rates R1, R2, and R3 may or may not be the same as each other, depending on the overhead added by each of the FEC encoding processes 201, 202, and 203. At a minimum, it may be understood that applying the FEC encoding processes 200, 201, 202, and 203 to the set of information bits 102 generates a set of FEC-encoded bits (A0, A1, A2, A3) which consists of at least two classes, where each class is associated with a distinct information rate R. That is, the FEC-encoded bits of any one class have an information rate R that is distinct from information rates R of the FEC-encoded bits of the other classes. One of the classes consists of the FEC-encoded bits of the subset A0. Depending on the information rates R1, R2, and R3 associated with the subsets A1, A2, and A3, there may be one, two, or three additional classes. For example, in the event that R1=R2≠R3, the FEC encoding processes 200, 201, 202, and 203 will generate a set of FEC-encoded bits (A0, A1, A2, A3) consisting of three classes: (1) subset A0 comprising bits having the information rate R=R0; (2) subsets A1 and A2, comprising bits having the information rate R=R1=R2; and (3) subset A3 comprising bits having the information rate R=R3.

The set of FEC-encoded bits (A0, A1, A2, A3) may undergo contrast encoding 204 in order to generate a set of contrast-encoded bits consisting of the subsets B0, B1, B2, and B3. In the example of FIG. 2, the contrast encoding 204 generates the contrast-encoded bits of the subset B0 by applying an XOR operation 204-1 to the FEC-encoded bits of the subsets A0, A1, A2, and A3. Thus, the relationship between the bits of subset B0 and the bits of subsets A0, A1, A2, and A3 may be expressed as B0=A0⊕A1⊕A2⊕A3. The contrast-encoded bits of the subsets B1, B2, and B3 are identical to the FEC-encoded bits of the subsets A1, A2, and A3, respectively. Following the contrast encoding 204, the set of contrast-encoded bits (B0, B1, B2, B3) may undergo modulation 205. A signal representative of symbols formed from the contrast-encoded bits may then be transmitted to the receiver end.

It is noted that the number of bits in the set of contrast-encoded bits (B0, B1, B2, B3) is the same as the number of bits in the set of FEC-encoded bits (A0, A1, A2, A3). In other words, no redundancy is added by the contrast encoding 204. The XOR operation 204-1 of the contrast encoding 204 creates a dependency between the bits that may be exploited during decoding at the receiver end.

Referring now to FIG. 3, the signal received at the receiver end may undergo demodulation 305, which is the inverse of the modulation 205 performed at the transmitter end, and a plurality of symbols may be detected. From these symbols, a set of bit estimates (B0', B1', B2', B3') may be decoded. The bit estimates of subsets B0', B1', B2', and B3' may comprise confidence values, such as log-likelihood ratios, corresponding to estimates of the contrast-encoded bits of the subsets B0, B1, B2, and B3, respectively, generated at the transmitter end. As a result of the IID modulation format, each bit estimate recovered from the demodulation 305 is expected to be independent of the other recovered bit estimates and to have the same BER.

The set of bit estimates (B0', B1', B2', B3') may then undergo a successive decoding process that involves contrast decoding 304 in conjunction with feedback of error-free bits obtained from at least some of the FEC decoding processes 300, 301, 302, and 303. The process of successive decoding may be advantageously used as a consequence of the dependency created between the bits at the transmitter end, which results in the bit estimates at the receiver end having contrasting BERs.

As illustrated in Tranche 1 of FIG. 4, the contrast decoding 304 applies a combining operation 304-1 to the bit estimates of the subsets B0', B1', B2', and B3' in order to generate a first class A0' of bit estimates. The combining operation 304-1 may comprise, for example, a calculation of a sum-product operation or a min-sum approximation. When the bit estimates of the subsets B0', B1', B2', and B3' are log-likelihood ratios, and the combining operation 304-1 is a sum-product operation, the first class A0' of bit estimates is calculated as A0'=ϕ(ϕ(B0')+ϕ(B1')+ϕ(B2')+ϕ(B3')), where $$\phi(x) = \log \frac{e^x + 1}{e^x - 1}.$$

This function may be approximated in a lookup table. When the bit estimates of the subsets B0', B1', B2', and B3' are log-likelihood ratios, and the combining operation 304-1 is chosen to be a min-sum approximation, the first class A0' of bit estimates is calculated as $$A0' = \prod_{i \in \{0,1,2,3\}} \text{sign}(Bi') \min_{i \in \{0,1,2,3\}} |Bi'|,$$

where sign($B_i'$) is +1 or −1, corresponding to the sign of $B_i'$. For simplicity, the combining operation 304-1 may be denoted by the symbol "+". Because the first class A0' of bit estimates relies on the bit estimates of each of the subsets B0', B1', B2', and B3', errors in the bit estimates of the subsets B0', B1', B2', and B3' are effectively concentrated into the bit estimates of the first class A0'. Accordingly, the bit estimates of the first class A0' may be expected to have a relatively high BER.

To permit the recovery of a subset A0* of error-free bits from the bit estimates of the first class A0' (which have a high BER as a result of the contrast decoding 304), a strong FEC scheme with high protection may be used. Such a strong FEC scheme is implemented in this example by the combination of the FEC encoding process 200 at the transmitter end and the FEC decoding process 300 at the receiver end. Application of the FEC decoding 300 to the first class A0' of bit estimates produces the subset A0* of error-free bits, which forms part of the recovered information bits 126, as shown in FIG. 3.

Returning to FIG. 4, the subset A0* of error-free bits may be fed back into the contrast decoding 304 for use in Tranche 2. Specifically, using the knowledge of the error-free bits of the subset A0* in combination with the bit estimates of the subsets B0', B2', and B3' recovered from the demodulation 305, the relationship defined by the combining operation 304-1 may be used to generate a result denoted by 400. The result 400 and the bit estimates of the subset B1' may be combined using combining means 401 to generate a second class A1' of bit estimates. It is noted that the combining means 401 employs an operation that is distinct from the combining operation 304-1. As an example, where the result 400 and the bit estimates of the subset B1' are expressed in log-likelihood ratios, the combining means 401 may comprise a summation of the log-likelihood ratios. In this example, the FEC scheme applied to the bit estimates of the second class A1' is implemented by the combination of FEC encoding 201 and FEC decoding 301. As a result of the contrast coding and the additional information provided by the subset A0* of error-free bits, the bit estimates of the second class A1' have a lower BER than the bit estimates of the first class A0'. Accordingly, the second class A1' may be suited to a higher-rate FEC scheme than the first class A0'. As illustrated in Tranche 2 of FIG. 4, application of the FEC decoding 301 to the bit estimates of the second class A1' produces a subset A1* of error-free bits, which forms part of the recovered information bits 126.

The subset A1* of error-free bits may also be fed back into the contrast decoding 304 for use in Tranche 3. Specifically, using the knowledge of the error-free bits of the subset A0* (determined from Tranche 1) and the error-free bits of the subset A1* (determined from Tranche 2) in combination with the bit estimates of the subsets B0' and B3' recovered from the demodulation 305, the relationship defined by the combining operation 304-1 may be used to generate a result denoted by 402. Using the combining means 401, the result 402 may be combined with the bit estimates of the subset B2' to generate a third class A2' of bit estimates. In this example, the FEC scheme applied to the bit estimates of the third class A2' is implemented by the combination of FEC encoding 202 and FEC decoding 302. As a consequence of the contrast coding and the additional information provided by the subsets A0* and A1* of error-free bits, the bit estimates of the third class A2' have a lower BER than the bit estimates of the second class A1'. Accordingly, the third class A2' may be suited to a relatively high-rate FEC scheme with low overhead. As illustrated in Tranche 3, application of the FEC decoding 302 to the bit estimates of the third class A2' produces a subset A2* of error-free bits, which forms part of the recovered information bits 126.

The subset A2* of error-free bits may also be fed back into the contrast decoding 304 for use in Tranche 4. Specifically, using the knowledge of the error-free bits of the subset A0* (determined from Tranche 1), the error-free bits of the subset A1* (determined from Tranche 2), and the error-free bits of the subset A2* (determined from Tranche 3) in combination with the bit estimates of the subset B0' recovered from the demodulation 305, the relationship defined by the combining operation 304-1 may be used to generate a result 403. Using the combining means 401, the result 403 may be combined with the bit estimates of the subset B3' to generate a fourth class A3' of bit estimates. In this example, the FEC scheme applied to the fourth class A3' of bit estimates is implemented by the combination of FEC encoding 203 and FEC decoding 303. As a result of the contrast coding and the knowledge of the subsets A0*, A1*, and A2* of error-free bits, the calculation of the bit estimates of the fourth class A3' will have the lowest BER of the contrast-encoded bits. The fourth class A3' may therefore be suited to relatively high-rate FEC scheme with low overhead. As illustrated in Tranche 4, application of the FEC decoding 303 to the bit estimates of the third class A3' produces a subset A3* of error-free bits, which is used to form the final part of the recovered information bits 126. Assuming that all bit errors are corrected by the FEC schemes, the recovered information bits 126 should be identical to the original information bits 102.

When decoding is performed using four different tranches, as illustrated in FIG. 4, each class of contrast-decoded bit estimates A0', A1', A2', and A3' will have a different BER.

In an alternative example (not shown), the decoding illustrated in FIG. 4 may be performed in only two tranches, rather than four. Specifically, the contrast-decoded bit estimates denoted by A1', A2', and A3' may be decoded in the same tranche, each relying on feedback of the subset A0* of error-free bits. In this case, the contrast-decoded bit estimates A1', A2', and A3' would have the same BER and would belong to the same class, thereby resulting in only two classes of bit estimates: (1) A0'; and (2) A1', A2', A3'.

In a variation of the first example (not shown), if the strength requirement of the FEC scheme defined by the FEC encoding 200 and FEC decoding 300 was too stringent, the BER of the bit estimates of the class A0' could be reduced by incorporating a repetition code in the contrast encoding 204. For example, a repetition code of length 2 would increase the noise tolerance of the contrast-decoded bit estimates of the class A0', which might better match the tolerance of the FEC scheme defined by FEC encoding 200 and FEC decoding 300.

Figure 7:
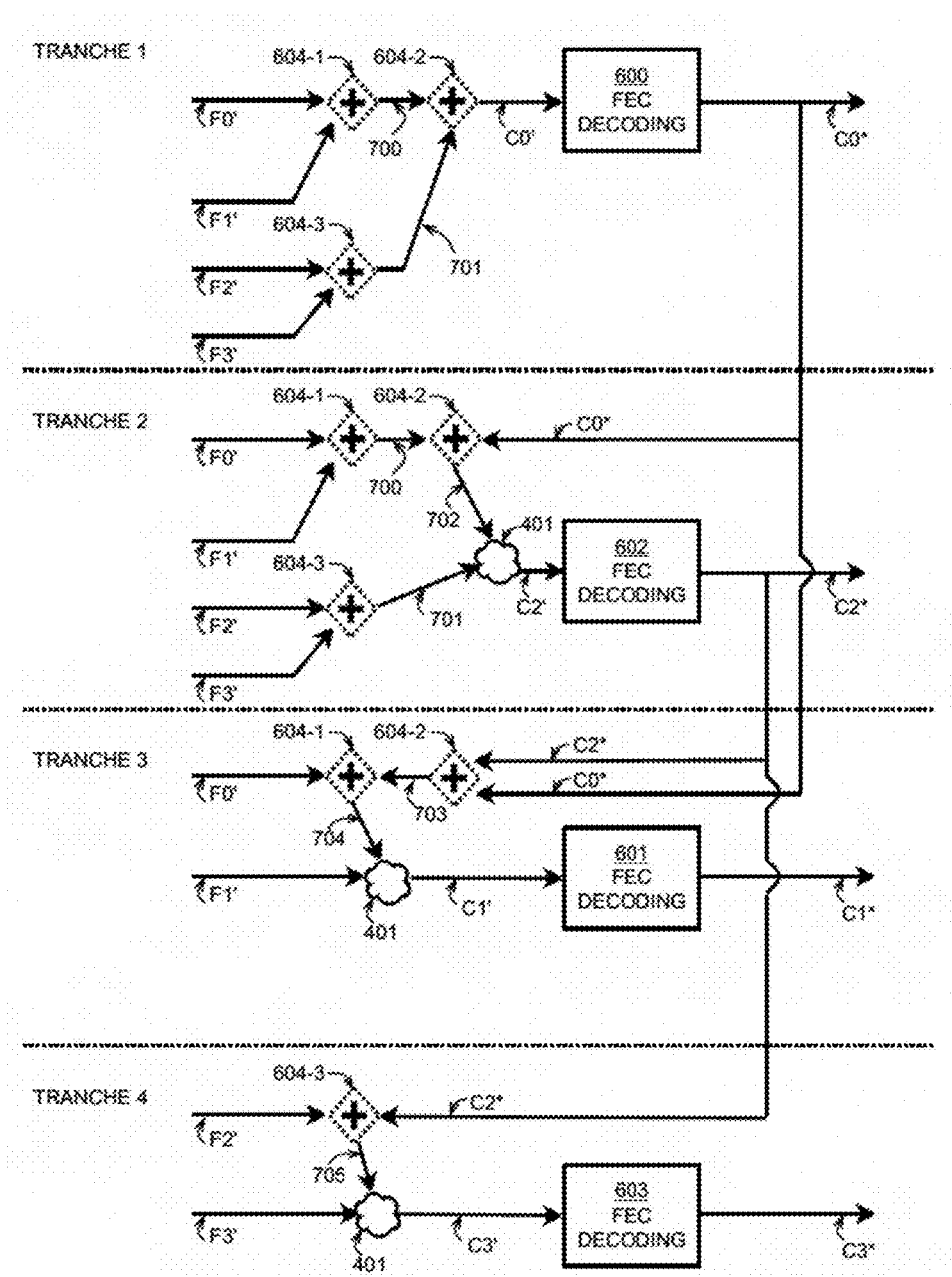
FIG. 7 schematically illustrates decoding steps performed at the receiver end of FIG. 6.

FIGS. 5, 6, and 7 illustrate a second example of FEC with contrast coding, where FIGS. 5 and 6 schematically illustrate the transmitter end and receiver end, respectively, and FIG. 7 schematically illustrates the successive decoding steps performed at the receiver end. As in the first example, an IID modulation format is used for data transmission.

In this second example, contrast coding is achieved using a mesh polynomial.

Referring to FIG. 5, the original information bits 102 are divided amongst a plurality of FEC encoding processes 500, 501, 502, and 503, in order to generate subsets C0, C1, C2, and C3 of FEC-encoded bits, respectively. The FEC-encoded bits of the subsets C0, C1, C2, and C3 have corresponding information rates R0, R1, R2, and R3, respectively, which depend on the strengths of the respective FEC-encoding processes 500, 501, 502, and 503. As will be discussed with respect to FIG. 6, the receiver end is configured to perform a plurality of FEC decoding processes 600, 601, 602, and 603, which correspond, respectively, to the FEC encoding processes 500, 501, 502, and 503 performed at the transmitter end.

In this example, the FEC encoding processes 500 and 502 are stronger than the FEC encoding processes 501 and 503. Accordingly, those of the information bits 102 that undergo the FEC encoding processes 500 and 502 are provided with more protection/redundancy than the rest of the information bits 102. Thus, it may be said that the FEC-encoded bits of the subsets C0 and C2 have lower information rates R0 and R2 than the information rates R1 and R3 of the FEC-encoded bits of the subsets C1 and C3. The information rates R0 and R2 may or may not be the same as each other, depending on the overhead added by each of the FEC encoding processes 500 and 502. The information rates R1 and R3 may or may not be the same as each other, depending on the overhead added by each of the FEC encoding processes 501 and 503. As in the previous example, it may be understood that applying the FEC encoding processes 500, 501, 502, and 503 to the set of information bits 102 generates a set of FEC-encoded bits (C0, C1, C2, C3) which consists of at least two classes, where each class is associated with a distinct information rate R. For example, in the event that R0=R2 and that R1=R3, the FEC encoding processes 500, 501, 502, and 503 will generate a set of FEC-encoded bits (C0, C1, C2, C3) consisting of two classes: (1) subsets C0 and C2, comprising bits having the information rate R=R0=R2; and (2) subsets C1 and C3, comprising bits having the information rate R=R1=R3.

The set of FEC-encoded bits (C0, C1, C2, C3) may undergo contrast encoding 504 in order to generate a set of contrast-encoded bits consisting of the subsets F0, F1, F2, and F3. In the example of FIG. 5, the contrast encoding 504 generates the contrast-encoded bits of the subset F0 by applying a first XOR operation 504-1 to the FEC-encoded bits of the subsets C0 and C2, and applying a second XOR operation 504-2 to the FEC-encoded bits of the subset C1 and to the result of the first XOR operation 504-1. Thus, the relationship between the bits of subset F0 and the bits of subsets C0, C1, and C2 may be expressed as F0=(C0⊕C2)⊕C1=C0⊕C1⊕C2. The contrast-encoded bits of the subset F2 are generated by applying the XOR operation 504-3 to the FEC-encoded bits of the subset C2 and C3, which may be expressed as F2=C2⊕C3. The contrast-encoded bits of the subsets F1 and F3 are identical to the FEC-encoded bits of the subsets C1 and C3, respectively. Following the contrast encoding 504, the set of contrast-encoded bits (F0, F1, F2, F3) may undergo modulation 505. A signal representative of symbols formed from the contrast-encoded bits may then be transmitted to the receiver end.

Similarly the first example, the number of bits in the set of contrast-encoded bits (F0, F1, F2, F3) is the same as the number of bits in the set of FEC-encoded bits (C0, C1, C2, C3). In other words, no redundancy is added by the contrast encoding 504. The XOR operations 504-1, 504-2, and 504-3 of the contrast encoding 504 create a dependency between the bits which may be exploited during decoding at the receiver end.

Referring now to FIG. 6, the signal received at the receiver end may undergo demodulation 605, which is the inverse of the modulation 505 performed at the transmitter end, and a plurality of symbols may be detected. From these symbols, a set of bit estimates (F0', F1', F2', F3') may be decoded. The bit estimates of subsets F0', F1', F2', and F3' may comprise confidence values, such as log-likelihood ratios, corresponding to estimates of contrast-encoded bits of the subsets F0, F1, F2, and F3, respectively, generated at the transmitter end. As a result of the IID modulation format, each bit estimate recovered from the demodulation 505 is expected to be independent of the other recovered bit estimates and to have the same BER.

The set of bit estimates (F0', F1', F2', F3') may then undergo a successive decoding process that involves contrast decoding 604 benefiting from feedback of error-free bits obtained from at least some of the FEC decoding processes 600, 601, 602, and 603.

As illustrated in Tranche 1 of FIG. 7, the contrast decoding 604, which is the inverse of the contrast encoding 504 performed at the transmitter end, applies three combining operations 604-1, 604-2, and 604-3 to the subsets F0', F1', F2', and F3' in order to generate a first class C0' of bit estimates. Each of the combining operations 604-1, 604-2, and 604-3 may comprise, for example, a sum-product operation or a min-sum approximation, and is generally denoted by the symbol "+". The combining operation 604-1 outputs the result of (F0'+F1'), denoted by 700 in FIG. 7; the combining operation 604-3 outputs the result of (F2'+F3'), denoted by 701 in FIG. 7; and the combining operation 604-2 outputs the result of (F0'+F1')+(F2'+F3')=F0'+F1'+F2'+F3', denoted by C0' in FIG. 7. Because the first class of bit estimates C0' relies on the bit estimates of each of the subsets F0', F1', F2', and F3', errors in the bits estimates of the subsets F0', F1', F2', and F3' are effectively distilled into the bit estimates of the first class C0'. Accordingly, the bit estimates of the first class C0' may be expected to have a relatively high BER.

To permit the recovery of a subset C0* of error-free bits from the bit estimates of the first class C0' (which have a high BER as a result of the contrast decoding 604), a strong FEC scheme with high protection may be used. Such a strong FEC scheme is implemented in this example by the combination of the FEC encoding process 500 at the transmitter end and the FEC decoding process 600 at the receiver end. Application of the FEC decoding 600 to the first class C0' of bit estimates produces the subset C0* of error-free bits, which forms part of the recovered information bits 126, as shown in FIG. 6.

Returning to FIG. 7, the subset C0* of error-free bits may be fed back into the contrast decoding 604 for use in Tranche 2. Specifically, using the knowledge of the error-free bits of the subset C0* in combination with the result 700 of (F0'+F1'), where F0' and F1' are the subsets of bit estimates recovered from the demodulation 605, the relationship defined by the combining operation 604-2 may be used to generate a result denoted by 702. Using the combining means 401, the result 702 may be combined with the result 701 to generate a second class C2' of bit estimates. In this example, the FEC scheme applied to the bit estimates of the second class C2' is implemented by the combination of FEC encoding 502 and FEC decoding 602. As a result of the contrast coding and the additional information provided by the subset C0* of error-free bits, the bit estimates of the second class C2' have a lower BER than the bit estimates of the first class C0'. Accordingly, the second class C2' may be suited to a higher-rate FEC scheme than the first class C0'. However, the FEC scheme used for the second class C2' may be still be relatively strong. As illustrated in Tranche 2 of FIG. 7, application of the FEC decoding 602 to the bit estimates of the second class C2' produces a subset C2* of error-free bits, which forms part of the recovered information bits 126.

The subset C2* of error-free bits may also be fed back into the contrast decoding 604 for use in Tranche 3. Specifically, using the knowledge of the error-free bits of the subset C0* (determined from Tranche 1) and the error-free bits of the subset C2* (determined from Tranche 2), the relationship defined by the combining operation 604-2 may be used to generate a result denoted by 703. Using the result 703 and the bit estimates of the subset F0' recovered from the demodulation 605, the relationship defined by the combining operation 604-1 may be used to generate a result denoted by 704. Using the combining means 401, the result 704 may be combined with the bit estimates of the subset F1' to generate a third class C1' of bit estimates. In this example, the FEC scheme applied to the bit estimates of the third class C1' is implemented by the combination of FEC encoding 501 and FEC decoding 601. As a consequence of the contrast coding and the additional information provided by the subsets C0* and C2* of error-free bits, the bit estimates of the third class C1' have a lower BER than the bit estimates of the second class C2'. Accordingly, the third class C1' may be suited to a relatively high-rate FEC scheme with low overhead. As illustrated in Tranche 3, application of the FEC decoding 601 to the bit estimates of the third class C1' produces a subset C1* of error-free bits, which forms part of the recovered information bits 126.

The subset C2* of error-free bits may also be fed back into the contrast decoding 604 for use in Tranche 4. Specifically, using the knowledge of the error-free bits of the subset C2*, in combination with the bit estimates of the subset F2' recovered from the demodulation 605, the relationship defined by the combining operation 604-3 may be used to generate a result denoted by 705. Using the combining means 401, the result 705 may be combined with the bit estimates of the subset F3' recovered from the demodulation 605 to generate a fourth class C3' of bit estimates. In this example, the FEC scheme applied to the bit estimates of the fourth class C3' is implemented by the combination of FEC encoding 503 and FEC decoding 603. As a result of the contrast coding and the information provided by the subset C2* of error-free bits, the bit estimates of the fourth class C3' have the lowest BER of the contrast-decoded bit estimates. Accordingly, the fourth class C3' may be suited to a relatively high-rate FEC scheme with low overhead. As illustrated in Tranche 4, application of the FEC decoding 603 to the bit estimates of the fourth class C3' produces a subset C3* of error-free bits, which forms the final part of the recovered information bits 126. Assuming that all bit errors are corrected by the FEC schemes, the recovered information bits 126 should be identical to the original information bits 102.

Figure 10:
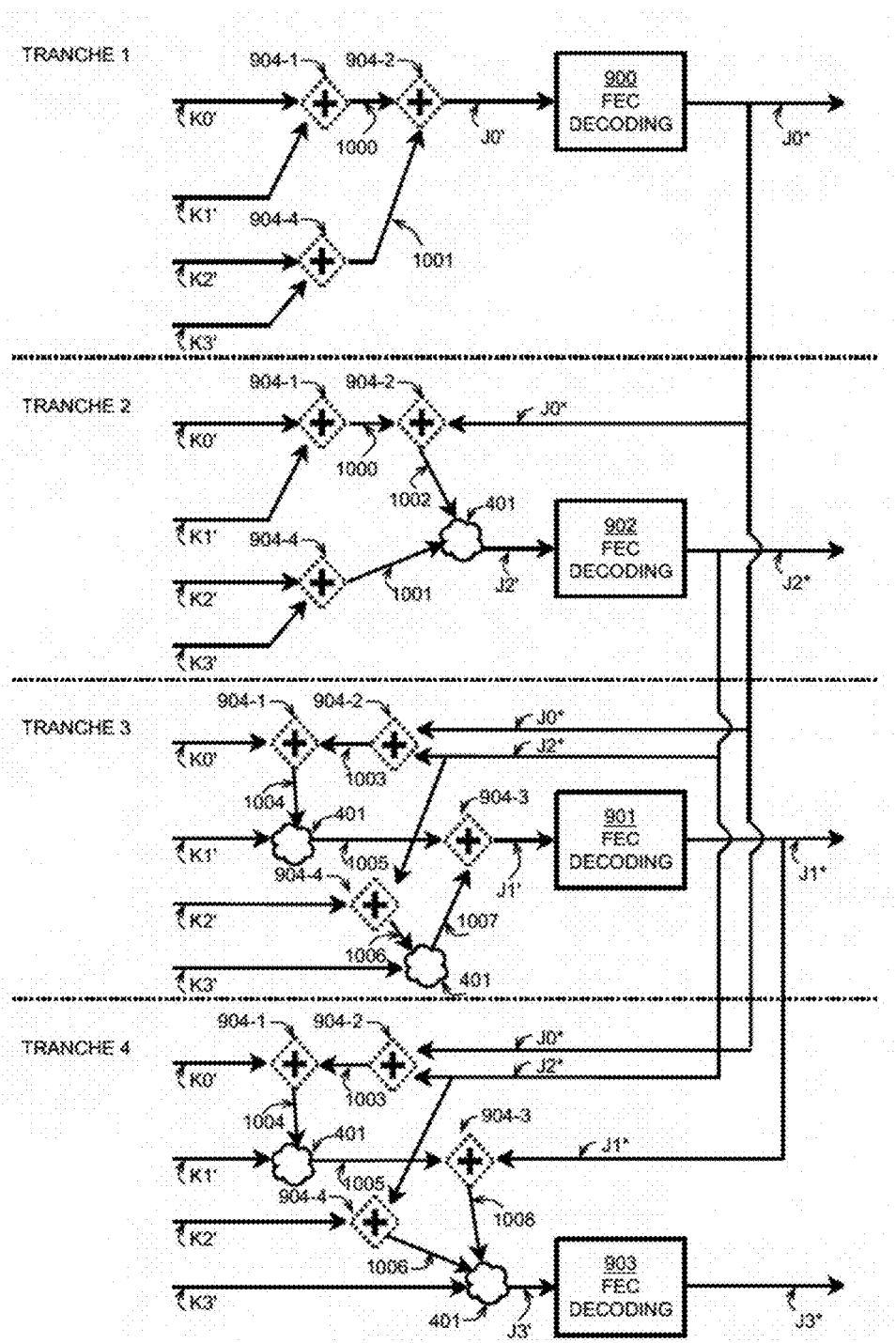
FIG. 10 schematically illustrates decoding steps performed at the receiver end of FIG. 9.

FIGS. 8, 9, and 10 illustrate a third example of FEC with contrast coding, where FIGS. 8 and 9 schematically illustrate the transmitter end and receiver end, respectively, and FIG. 10 schematically illustrates the successive decoding steps performed at the receiver end. As in the previous examples, an IID modulation format is used for data transmission.

As in the second example, contrast coding is achieved in this third example using a mesh polynomial.

Referring to FIG. 8, the original information bits 102 are divided amongst a plurality of FEC encoding processes 800, 801, 802, and 803, in order to generate subsets J0, J1, J2, and J3 of FEC-encoded bits, respectively. The FEC-encoded bits of the subsets J0, J1, J2, and J3 have corresponding information rates R0, R1, R2, and R3, respectively, which depend on the strengths of the respective FEC-encoding processes 800, 801, 802, and 803. As will be discussed with respect to FIG. 9, the receiver end is configured to perform a plurality of FEC decoding processes 900, 901, 902, and 903, which correspond, respectively, to the FEC encoding processes 800, 801, 802 and 803 performed at the transmitter end.

In this example, the FEC encoding process 800 is very strong; the FEC encoding processes 801 and 802 are moderately strong, but provide less overhead than the FEC encoding process 800; and the FEC encoding process 803 provides the least amount of protection/redundancy. Thus, it may be said that the FEC-encoded bits of the subset J0 have the lowest information rate R0, while the FEC-encoded bits of the subset J3 have highest information rate R3. The information rates R1 and R2 may or may not be the same as each other, depending on the overhead added by each of the FEC encoding processes 801 and 802. In the event that R1=R2, the FEC encoding processes 800, 801, 802, and 803 will generate a set of FEC-encoded bits (J0, J1, J2, J3) consisting of three classes: (1) subset J0, comprising bits having the information rate R=R0; (2) subsets J1 and J2, comprising bits having the information rate R=R1=R2; and (3) subset J3, comprising bits having the information rate R=R3.

The set of FEC-encoded bits (J0, J1, J2, J3) may undergo contrast encoding 804 in order to generate a set of contrast-encoded bits consisting of the subsets K0, K1, K2, and K3.

In the example of FIG. 8, the contrast encoding 804 generates the contrast-encoded bits of the subset K0 using three XOR operations 804-1, 804-2, and 804-3. When combined, the output of the XOR operations 804-1, 804-2, and 804-3 may be expressed as K0=(J0⊕J2)⊕(J1⊕J3) =J0⊕J1⊕J2⊕J3. The contrast-encoded bits of the subset K1 are generated by applying the XOR operation 804-3 to the FEC-encoded bits of the subsets J1 and J3, which may be expressed as K1=J1⊕J3. The contrast-encoded bits of the subset K2 are generated by applying the XOR operation 804-4 to the FEC-encoded bits of the subsets J2 and J3, which may be expressed as K2=J2–J3. The contrast-encoded bits of the subset K3 are identical to the FEC-encoded bits of the subset J3. Following the contrast encoding 804, the set of contrast-encoded bits (K0, K1, K2, K3) may undergo modulation 805. A signal representative of symbols formed from the contrast-encoded bits may then be transmitted to the receiver end.

As in the previous examples, the number of bits in the set of contrast-encoded bits (K0, K1, K2, K3) is the same as the number of bits in the set of FEC-encoded bits (J0, J1, J2, J3). In other words, no redundancy is added by the contrast encoding 804. The XOR operations 804-1, 804-2, 804-3, and 804-4 of the contrast encoding 804 create a dependency between the bits which may be exploited during decoding at the receiver end.

Referring now to FIG. 9, the signal received at the receiver end may undergo demodulation 905, which is the inverse of the modulation 805 performed at the transmitter end, a plurality of symbols may be detected. From these symbols, a set of bit estimates (K0', K1', K2', K3') may be decoded. The bit estimates of the subsets K0', K1', K2', and K3' may comprise confidence values, such as log-likelihood ratios, corresponding to estimates of contrast-encoded bits of the subsets K0, K1, K2, and K3, respectively, generated at the transmitter end. As a result of the IID modulation format, each bit estimate recovered from the demodulation 905 is expected to be independent of the other recovered bit estimates and to have the same BER.

The set of bit estimates (K0', K1', K2', K3') may then undergo a successive decoding process that involves contrast decoding 904 together with feedback of error-free bits obtained from at least some of the FEC decoding processes 900, 901, 902, and 903.

As illustrated in Tranche 1 of FIG. 10, the contrast decoding 904, which is the inverse of the contrast encoding 804 performed at the transmitter end, applies three combining operations 904-1, 904-2, and 904-4 to the subsets of bit estimates K0', K1', K2', and K3' in order to generate a first class J0' of bit estimates. Each of the combining operations 904-1, 904-2, and 904-3 may comprise, for example, a sum-product operation or a min-sum approximation, and is generally denoted by the symbol "+". The combining operation 904-1 outputs the result of (K0'+K1'), denoted by 1000 in FIG. 10; the combining operation 904-4 outputs the result of (K2'+K3'), denoted by 1001 in FIG. 10; and the combining operation 904-2 outputs the result of (K0'+K1')+(K2'+K3')=K0'+K1'+K2'+K3', denoted by J0' in FIG. 10. Because the first class J0' of bit estimates relies on the bit estimates of each of the subsets K0', K1', K2', and K3', the bit estimates of the first class J0' may be expected to have a relatively high BER.

To permit the recovery of a subset J0* of error-free bits from the bit estimates of the first class J0' (which have a high BER as a result of the contrast decoding 904), a strong FEC scheme with high protection may be used. Such a strong FEC scheme is implemented in this example by the combination of the FEC encoding process 800 at the transmitter end and the FEC decoding process 900 at the receiver end. Application of the FEC decoding 900 to the first class J0' of bit estimates produces the subset J0* of error-free bits, which forms part of the recovered information bits 126, as shown in FIG. 9.

Returning to FIG. 10, the subset J0* of error-free bits may be fed back into the contrast decoding 904 for use in Tranche 2. Specifically, using the knowledge of the error-free bits of the subset J0* in combination with the result 1000 of (K0'+K1'), where K0' and K1' are the subsets of bit estimates recovered from the demodulation 905, the relationship defined by the combining operation 904-2 may be used to generate a result denoted by 1002. Using the combining means 401, the result 1002 may be combined with the result 1001 to generate a second class J2' of bit estimates. In this example, the FEC scheme applied to the bit estimates of the second class J2' is implemented by the combination of FEC encoding 802 and FEC decoding 902. As a result of the contrast coding and the additional information provided by the subset J0* of error-free bits, the bit estimates of the second class J2' have a lower BER than the bit estimates of the first class J0'. Accordingly, the second class J2' may be suited to a higher-rate FEC scheme than the first class J0'. Accordingly, the second class J2' may be suited to a higher-rate FEC scheme than the first class J0'. As illustrated in Tranche 2 of FIG. 10, application of the FEC decoding 902 to the bit estimates of the second class J2' produces a subset J2* of error-free bits, which forms part of the recovered information bits 126.

The subset J2* of error-free bits may also be fed back into the contrast decoding 904 for use in Tranche 3. Specifically, using the knowledge of the error-free bits of the subset J0* (determined from Tranche 1) and the error-free bits of the subset J2* (determined from Tranche 2), the relationship defined by the combining operation 904-2 may be used to generate a result denoted by 1003. Using the result 1003 and the bit estimates of the subset K0' recovered from the demodulation 905, the relationship defined by the combining operation 904-1 may be used to generate a result denoted by 1004. Using the combining means 401, the result 1004 may be combined with the bit estimates of the subset K1' to generate a result denoted by 1005.

Also in Tranche 3, using the knowledge of the error-free bits of the subset J2*, in combination with the bit estimates of the subset K2' recovered from the demodulation 905, the relationship defined by the combining operation 904-4 may be used to generate a result denoted by 1006. Using the combining means 401, the result 1006 may be combined with the bit estimates of the subset K3' recovered from the demodulation 905, thereby generating a result denoted by 1007.

The combining operation 904-3 may be applied to the results 1005 and 1007 to generate a third class J1' of bit estimates. In this example, the FEC scheme applied to the bit estimates of the third class J1' is implemented by the combination of FEC encoding 801 and FEC decoding 901. As a consequence of the contrast coding and the additional information provided by the subsets J0* and J2*, the bit estimates of the third class J1' have a lower BER than the bit estimates of the second class J2'. Accordingly, the third class J1' may be suited to a higher-rate FEC scheme than the previous classes. As illustrated in Tranche 3, application of the FEC decoding 901 to the bit estimates of the third class J1' produces a subset J1* of error-free bits, which forms part of the recovered information bits 126.

The subset J1* of error-free bits may also be fed back into the contrast decoding 904 for use in Tranche 4. As described with respect to Tranche 3, the knowledge of the error-free bits of the subset J0* (determined from Tranche 1) and the error-free bits of the subset J2* (determined from Tranche 2) may be used together with the relationships defined by the combining operations 904-1, 904-2, and 904-4 to produce the results 1005 and 1006.

Using the error-free bits of the subset J1* in combination with the result 1005, the relationship defined by the combining operation 904-3 may be used to generate a result denoted by 1008. Using the combining means 401, the result 1008 may be combined with the result 1006, and also with the bit estimates of the subset K3' recovered from the demodulation 905 to generate a fourth class J3' of bit estimates. In this example, the FEC scheme applied to the bit estimates of the fourth class is implemented by the combination of FEC encoding 803 and FEC decoding 903. As a result of the contrast coding and the information provided by the subsets J0*, J1*, and J2* of error-free bits, the bit estimates of the fourth class J3' have the lowest BER of the contrast-decoded bit estimates. Accordingly, the fourth class J3' may be suited to a relatively high-rate FEC scheme. As illustrated in Tranche 4, application of the FEC decoding 903 to the bit estimates of the fourth class J3' produces a subset J3* of error-free bits, which forms the final part of the recovered information bits 126. Assuming that all bit errors are corrected by the FEC schemes, the recovered information bits 126 should be identical to the original information bits 102.

Figure 11:
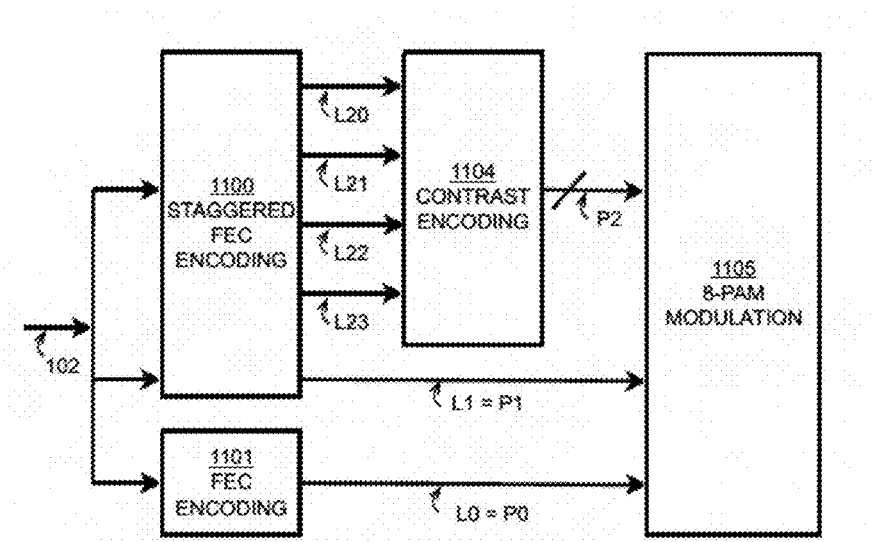
FIG. 11 schematically illustrates an example architecture of a transmitter end implementing FEC with contrast encoding.
Figure 12:
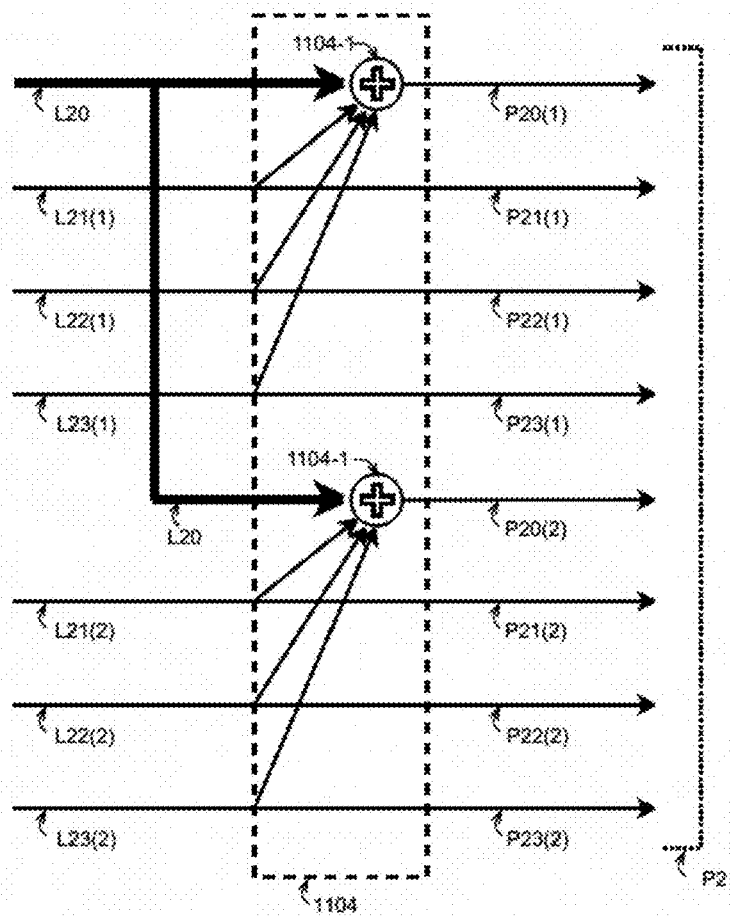
FIG. 12 schematically illustrates the contrast encoding process performed at the transmitter end of FIG. 11.
Figure 13:
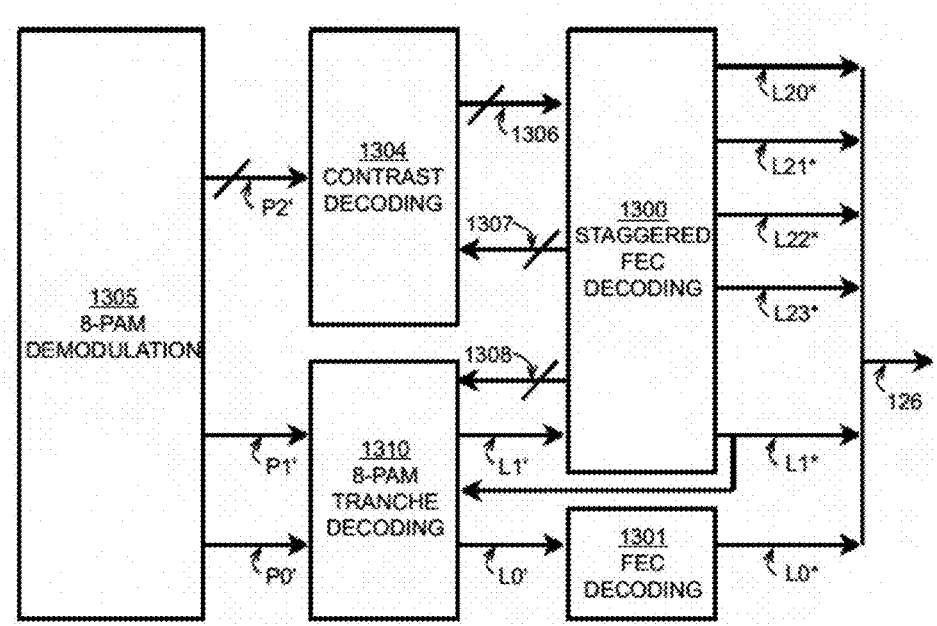
FIG. 13 schematically illustrates an example architecture of a receiver end implementing FEC with contrast decoding corresponding to the FEC and contrast encoding of FIG. 11.

FIGS. 11, 12, and 13 illustrate a fourth example of FEC with contrast coding, where FIGS. 11 and 12 schematically illustrate the transmitter end and receiver end, respectively, and FIG. 13 schematically illustrates the contrast encoding process performed at the transmitter end of FIG. 11.

In contrast to the previous examples, which used an IID modulation format, this example uses an 8-PAM modulation format with natural labeling for data transmission. According to this modulation format, the signal at a given point in time is expected to indicate one of eight possible symbols or points on one axis: "000" "001" "010" "011" "100" "101" "110" "111". Each symbol represents three bits, where the rightmost bit is the LSB, the middle bit is the $2^{nd}$ LSB, and the leftmost bit is the $3^{rd}$ LSB (also referred to as the MSB). Applying demodulation to the signal will result in one of those eight symbols, from which the three bits represented by that symbol may be recovered. For ease of explanation, the LSB is referred to in this example as P2, the $2^{nd}$ LSB is referred to as P1, and the MSB is referred to as P0. That is, a given symbol represents the bits "P0 P1 P2". With this modulation format, it should be apparent that the P0 will experience the lowest BER, P1 will experience a somewhat higher BER, and P2 will experience the highest BER.

Referring to FIG. 11, the original information bits 102 are divided amongst two FEC encoding processes 1100 and 1101. The FEC encoding 1100 corresponds to a staggered FEC scheme, while the FEC encoding 1101 corresponds to a high-rate FEC scheme. A detailed discussion of staggered FEC, also referred to as staggered parity, is provided in U.S. Pat. No. 9,537,608, which is herein incorporated by reference in its entirety. As will be discussed with respect to FIG. 13, the receiver end is configured to perform FEC decoding processes 1300 and 1301, which correspond, respectively, to the FEC encoding processes 1100 and 1101 performed at the transmitter end.

The FEC encoding process 1101 generates a subset L0 of FEC-encoded bits. The staggered FEC encoding process 1100 generates subsets L1, L20, L21, L22, and L23 of FEC-encoded bits. For ease of explanation, the subset L0 may also be denoted by P0, and the subset L1 may also be denoted by P1.

The subsets L1, L20, L21, L22, and L23 generated by the staggered FEC encoding 1100 are staggered in time. For example, if the subset L20 is generated at time t=0, then the subset L21 is generated at t=1, the subset L22 is generated at t=2, the subset L23 is generated at t=3, and the subset L1 is generated at t=4. Although not explicitly illustrated in FIG. 11, appropriate delays may be applied to the different subsets so that the FEC-encoded bits of the subsets L20, L21, L22, and L23 are inputted to the contrast encoding process 1104 at substantially the same time as each other, and also at substantially the same time that the subsets L0 and L1 are outputted by the FEC-encoding processes 1101 and 1100, respectively.

The FEC encoding processes 1100 and 1101 will generate a set of FEC-encoded bits (L20, L21, L22, L23, L1, L0) consisting of two classes: (1) subsets L20, L21, L22, L23, L1, comprising FEC-encoded bits having a first information rate; and (2) subset L0, comprising FEC-encoded bits having a second information rate, where the second information rate is distinct from and higher than the first information rate. The first information rate and the second information rate are dependent on the relative strengths of the FEC encoding processes 1100 and 1101.

The FEC-encoded bits of the subsets L20, L21, L22, and L23 may undergo contrast encoding 1104 in order to generate a set of contrast-encoded bits denoted by P2. In this example, the contrast encoding 1104 is similar to the contrast encoding 204, described with respect to FIG. 2, except that it is performed in conjunction with a repetition code of length 2 applied to the bits of the subset L20. Thus, for each instance of the subset L20 that undergoes the contrast encoding 1104, there are two instances of each of the subsets L21, L22, and L23 that undergo the contrast encoding 1104. This is illustrated in more detail in FIG. 12.

A subset contrast-encoded bits denoted by P20(1) is generated by applying an XOR operation 1104-1 to the FEC-encoded bits of the subset L20 and a first instance of each of the subsets L21, L22, and L23, denoted respectively as L21(1), L22(1), and L23(1). Thus, the relationship between the bits of the subset P20(1) and the bits of the subsets L20, L21(1), L22(1), and L23(1) may be expressed as P20(1)=L20⊕L21(1)⊕L22(1)⊕L23(1). The contrast-encoded bits of subsets P21(1), P22(1), and P23(1) are identical to the FEC-encoded bits of the subsets L21(1), L22(1), and L23(1), respectively. A subset P20(2) of contrast-encoded bits is generated by applying the XOR operation 1104-1 to the FEC-encoded bits of the subset L20 and a second instance of each of the subsets L21, L22, and L23, denoted respectively as L21(2), L22(2), and L23(2). Thus, the relationship between the bits of the subset P20(2) and the bits of the subsets L20, L21(2), L22(2), and L23(2) may be expressed as P20(2)=L20⊕L21(2)⊕L22(2)⊕L23(2). The contrast-encoded bits of subsets P21(2), P22(2), and P23(2) are identical to the FEC-encoded bits of the subsets L21(2), L22(2), and L23(2), respectively. Thus, by applying the contrast encoding 1104 to the FEC-encoded bits of seven subsets L20, L21(1), L22(1), L23(1), L21(2), L22(2), and L23(2), where the subset L20 is repeated twice, the set P2 of contrast-encoded bits is generated, which consists of the eight subsets P20(1), P21(1), P22(1), P23(1), P20(2), P21(2), P22(2), and P23(2).

Following the contrast encoding 1104, the 8-PAM modulation 1105 may be applied to the contrast-encoded bits of the subsets P2, P1, and P0, in order to generate a signal to be transmitted to the receiver end.

In this example, contrary to previous examples, the contrast encoding 1104 adds redundancy to the bits. This is a result of the repetition code. For example, for every seven FEC-encoded bits that are inputted to the contrast encoding 1104, eight contrast-encoded bits are outputted. It should be apparent that, for every eight contrast-encoded bits of the subset P2 that undergo the 8-PAM modulation, there will be eight bits belonging to the subset P1, and eight bits belonging to the subset P0.

Referring now to FIG. 13, the signal received at the receiver end may undergo demodulation 1305, which is the inverse of the modulation 1105 that was performed at the transmitter end, and a plurality of symbols may be detected. From these symbols, a set of bit estimates (P2', P1', P0') may be decoded. The bit estimates of the set P2' correspond to estimates of the set P2 of contrast-encoded bits generated at the transmitter end. Although not explicitly illustrated in FIG. 13, the bit estimates of the set P2' comprise subsets denoted by P20(1)', P21(1)', P22(1)', P23(1)', P20(2)', P21(2)', P22(2)', and P23(2)', which correspond, respectively, to estimates of the contrast-encoded bits of the subsets P20(1), P21(1), P22(1), P23(1), P20(2), P21(2), P22(2), and P23(2) generated at the transmitter end. The bit estimates of subsets P1' and P0' correspond to estimates of the contrast-encoded bits of the subsets P1 and P0, respectively, generated at the transmitter end. As in the previous examples, the bit estimates may comprise confidence values, such as log-likelihood ratios.

As previously discussed, as a result of the 8-PAM modulation format, the bit estimates of subset P2' will experience the highest BER, while the bit estimates of subset P1' will experience a somewhat lower BER, and the bit estimates of subset P0' will experience the lowest BER.

The set P2' of bit estimates may undergo a successive decoding process that involves contrast decoding 1304 in conjunction with feedback of error-free bits obtained from the staggered FEC decoding 1300. As denoted by 1306, a series of classes of contrast-decoded bit estimates may be generated by the contrast decoding 1304, using feedback of one or more subsets of error-free bits, as denoted by 1307.

Referring back to FIG. 4, a first class L20' of contrast-decoded bit estimates may be determined in a manner similar to that used to determine class A0' in Tranche 1. However, in this case, because the subset L20 has undergone a repetition code, the first class L20' of contrast-decoded bit estimates may be determined from a combination of two different estimates for the bit estimates of the first class L20'. For example, one estimate of the first class L20' may be determined by applying the combining operation 304-1 to the subsets P20(1)', P21(1)', P22(1)', and P23(1)'; and another estimate of the first class L20' may be determined by applying the combining operation 304-1 to the subsets P20(2)', P21(2)', P22(2)', and P23(2)'. The combining means 401 may then be applied to the two estimates to generate the first class L20' of contrast-decoded bit estimates.

Application of the FEC decoding 1300 to the first class L20' of bit estimates produces the subset L20* of error-free bits, which forms part of the recovered information bits 126, as shown in FIG. 13. Following the same procedure described with respect to FIG. 4, the subset L20* of error-free bits may be fed back into the contrast decoding 1304. In this case, however, two separate processes of tranche decoding may be performed in parallel: one to determine the error-free bits of the subsets L21(1)*, L22(1)*, and L23(1)*; and another to determine the error-free bits of the subsets L21(2)*, L22(2)*, and L23(2)*.

In addition to forming part of the recovered information bits 126, the error-free bits of the subsets L20*, L21*, L22*, and L23* may also be used to assist in the decoding of classes L1' and L0' of bit estimates. As denoted by 1308, the knowledge of the error-free bits of the subsets L20*, L21*, L22*, and L23* may be exploited in a tranche decoding process 1310 that relies on the dependency between bits when using the 8-PAM modulation format. A process for 8-PAM tranche decoding is described in U.S. Pat. No. 9,537,608. In short, the feedback 1308 may be used to generate the class L1' of bit estimates, which is effectively an improvement upon the bit estimates of the subset P1'. As illustrated in FIG. 13, the staggered FEC decoding 1300 is applied to the class L1' of bit estimates to produce a subset L1* of error-free bits, which forms part of the recovered information bits 126. The subset L1* of error-free bits may then be used with the 8-PAM tranche decoding 1310 to generate the class L0' of bit estimates, which is effectively an improvement upon the bit estimates of the subset P0'. The high-rate FEC decoding 1301 is then applied to the class L0' of bit estimates to produce a subset L0* of error-free bits, which forms the final part of the recovered information bits 126.

What is claimed is:

1. A method for transmission of information bits over a communications channel between a transmitter device and a receiver device, the method comprising:

at the transmitter device
applying forward error correction (FEC) encoding to a set of information bits to generate first bits consisting of N classes of bits, wherein N≥2, and wherein each class is associated with a distinct information rate;
applying contrast encoding to the first bits to generate second bits, the second bits comprising at least one group consisting of second bits that are dependent on the first bits of at least two of the N classes;
mapping the second bits to symbols; and
transmitting a signal representative of the symbols over the communications channel;

at the receiver device
detecting received symbols from a signal received over the communications channel;
decoding estimates of the second bits from the received symbols;
applying contrast decoding to the estimates of the second bits to generate estimates of a first class of the first bits, wherein the contrast decoding is the inverse of the contrast encoding applied at the transmitter device;
applying a first FEC decoding operation to the estimates of the first class to generate first error-free bits; and
using the contrast decoding and the first error-free bits to generate estimates of a second class of the first bits.

2. The method as claimed in claim 1, wherein the FEC encoding comprises M parallel and disjoint FEC computations, wherein M≥N.

3. The method as claimed in claim 1, wherein the contrast encoding comprises a Boolean polynomial function.

4. The method as claimed in claim 3, wherein the polynomial function comprises a repetition code.

5. The method as claimed in claim 3, wherein the polynomial function comprises a single parity polynomial function.

6. The method as claimed in claim 3, wherein the polynomial function comprises a tree polynomial function.

7. The method as claimed in claim 3, wherein the polynomial function comprises a mesh polynomial function.

8. The method as claimed in claim 3, wherein the polynomial function comprises a multi-bit addition function.

9. The method as claimed in claim 1, wherein the estimates of the second class have a bit error ratio (BER) that is lower than a BER of the estimates of the first class.

10. A system for transmission of information bits over a communications channel, the system comprising:
- a transmitter device comprising a first processor and a first memory storing computer-executable instructions which, when executed by the first processor, cause the transmitter device
  - to apply forward error correction (FEC) encoding to a set of information bits to generate first bits consisting of N classes of bits, wherein N≥2, and wherein each class is associated with a distinct information rate;
  - to apply contrast encoding to the first bits to generate second bits, the second bits comprising at least one group consisting of second bits that are dependent on the first bits of at least two of the N classes;
  - to map the second bits to symbols; and
  - to transmit a signal representative of the symbols over the communications channel;
- a receiver device comprising a second processor and a second memory storing computer-executable instructions which, when executed by the second processor, cause the receiver device
  - to detect received symbols from a signal received over the communications channel;
  - to decode estimates of the second bits from the received symbols;
  - to apply contrast decoding to the estimates of the second bits to generate estimates of a first class of the first bits, wherein the contrast decoding is the inverse of the contrast encoding applied at the transmitter device;
  - to apply a first FEC decoding operation to the estimates of the first class to generate first error-free bits; and
  - to use the contrast decoding and the first error-free bits to generate estimates of a second class of the first bits.

11. The system as claimed in claim 10, wherein the FEC encoding comprises M parallel and disjoint FEC computations, wherein M≥N.

12. The system as claimed in claim 10, wherein the contrast encoding comprises a Boolean polynomial function.

13. The system as claimed in claim 12, wherein the polynomial function comprises a repetition code.

14. The system as claimed in claim 12, wherein the polynomial function comprises a single parity polynomial function.

15. The system as claimed in claim 12, wherein the polynomial function comprises a tree polynomial function.

16. The system as claimed in claim 12, wherein the polynomial function comprises a mesh polynomial function.

17. The system as claimed in claim 12, wherein the polynomial function comprises a multi-bit addition function.

18. The system as claimed in claim 10, wherein the estimates of the second class have a bit error ratio (BER) that is lower than a BER of the estimates of the first class.

* * * * *

UNITED STATES PATENT AND TRADEMARK OFFICE
CERTIFICATE OF CORRECTION

PATENT NO.         : 10,367,600 B2
APPLICATION NO.    : 15/672434
DATED              : July 30, 2019
INVENTOR(S)        : Shahab Oveis Gharan, Mohammad Ehsan Seifi and Kim B. Roberts It is certified that error appears in the above-identified patent and that said Letters Patent is hereby corrected as shown below:

In the Specification

At Column 17, Lines 12-13 should read:

which may be expressed as $K2 = J2 \oplus J3$. The contrast encoded bits of the subset K3 are identical to the FEC-encoded Signed and Sealed this
Twenty-seventh Day of August, 2019

Andrei Iancu
*Director of the United States Patent and Trademark Office*